(12) United States Patent
Sato et al.

(10) Patent No.: US 8,697,534 B2
(45) Date of Patent: Apr. 15, 2014

(54) CAPACITOR TO BE INCORPORATED IN WIRING SUBSTRATE, METHOD FOR MANUFACTURING THE CAPACITOR, AND WIRING SUBSTRATE

(75) Inventors: Motohiko Sato, Konan (JP); Kazuhiro Hayashi, Komaki (JP); Kenji Murakami, Kani (JP); Motonobu Kurahashi, Konan (JP); Yusuke Kaieda, Komaki (JP); Jun Otsuka, Konan (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 13/610,936

(22) Filed: Sep. 12, 2012

(65) Prior Publication Data

US 2013/0000820 A1  Jan. 3, 2013

Related U.S. Application Data

(62) Division of application No. 12/951,895, filed on Nov. 22, 2010, now Pat. No. 8,304,321, which is a division of application No. 11/643,871, filed on Dec. 22, 2006, now Pat. No. 7,863,662.

(30) Foreign Application Priority Data

Dec. 22, 2005 (JP) ................................. 2005-370945
Dec. 22, 2005 (JP) ................................. 2005-370946
Dec. 22, 2005 (JP) ................................. 2005-370947

(51) Int. Cl.
H01L 21/20 (2006.01)
(52) U.S. Cl.
USPC ........... 438/396; 438/244; 438/715; 438/662; 257/295

(58) Field of Classification Search
USPC .................. 257/295; 438/715, 662, 396, 244
See application file for complete search history.

(56) References Cited

U.S. PATENT DOCUMENTS

| 6,238,779 B1 | 5/2001 | Iwao et al. |
| 6,606,237 B1 | 8/2003 | Naito et al. |
| 6,876,554 B1 | 4/2005 | Inagaki et al. |

(Continued)

FOREIGN PATENT DOCUMENTS

| JP | 56-110220 A | 9/1981 |
| JP | 57-13791 A | 1/1982 |

(Continued)

OTHER PUBLICATIONS

Japanese Office Action dated Oct. 10, 2012 issued by the Japanese Patent Office in corresponding Japanese Patent Application No. 10-2006-0132293.

(Continued)

*Primary Examiner* — Jerome Jackson, Jr.
*Assistant Examiner* — Dale E Page
(74) *Attorney, Agent, or Firm* — Sughrue Mion, PLLC

(57) ABSTRACT

A wiring substrate in which a capacitor is provided, the capacitor comprising a capacitor body including a plurality of dielectric layers and internal electrode layers provided between the different dielectric layers, wherein said capacitor body has, in at least one side face of said capacitor body, recesses extending in a thickness direction of said capacitor body from at least one of a first principal face of said capacitor body and a second principal face positioned on the side opposite to the first principal face.

6 Claims, 26 Drawing Sheets

(56) References Cited

U.S. PATENT DOCUMENTS

| | | |
|---|---|---|
| 6,979,890 B2 | 12/2005 | Kambe et al. |
| 7,002,075 B2 | 2/2006 | Kambe et al. |
| 7,362,560 B2 | 4/2008 | Tsujimura et al. |
| 7,390,449 B2 | 6/2008 | Ibata et al. |
| 7,573,697 B2 | 8/2009 | Sato |
| 2005/0005420 A1* | 1/2005 | Hirano et al. .......... 29/593 |
| 2005/0050423 A1 | 3/2005 | Yasukawa et al. |
| 2005/0081987 A1 | 4/2005 | Takahara et al. |
| 2005/0157478 A1 | 7/2005 | Inagaki et al. |
| 2005/0269287 A1 | 12/2005 | Tsujimura et al. |
| 2006/0207355 A1 | 9/2006 | Yasukawa et al. |
| 2008/0055872 A1 | 3/2008 | Inagaki et al. |
| 2008/0158838 A1 | 7/2008 | Inagaki et al. |
| 2008/0158841 A1 | 7/2008 | Inagaki et al. |
| 2010/0118502 A1 | 5/2010 | Inagaki et al. |

FOREIGN PATENT DOCUMENTS

| | | |
|---|---|---|
| JP | 61-276396 | 12/1986 |
| JP | 63-71566 U | 5/1988 |
| JP | 7-50458 | 2/1995 |
| JP | 7-66076 A | 3/1995 |
| JP | 2001-332437 | 11/2001 |
| JP | 2002-144318 A | 5/2002 |
| JP | 2004-31926 | 1/2004 |
| JP | 2004-134575 | 4/2004 |
| JP | 2004-172305 | 6/2004 |
| JP | 2005-33558 | 2/2005 |
| JP | 2005-33559 | 2/2005 |
| JP | 2005-39217 | 2/2005 |
| JP | 2005-39243 | 2/2005 |
| JP | 2005-340663 A | 12/2005 |
| JP | 2005-347648 A | 12/2005 |
| KR | 20000047545 A | 7/2000 |
| KR | 20010092431 A | 10/2001 |
| TW | 200529260 A | 9/2005 |

OTHER PUBLICATIONS

Office Action, dated May 20, 2013, issued by the Taiwanese Patent Office in counterpart Taiwanese Patent Application No. 095148170.
Korean Office Action dated Oct. 10, 2012 issued by the Korean Intellectual Property Office in corresponding Korean Patent Application No. 10-2006-0132293.

* cited by examiner

CAPACITOR TO BE INCORPORATED IN WIRING SUBSTRATE, METHOD FOR MANUFACTURING THE CAPACITOR, AND WIRING SUBSTRATE

CROSS REFERENCE TO RELATED APPLICATIONS

This is a divisional of U.S. application Ser. No. 12/951,895 filed Nov. 22, 2010 which is a divisional of U.S. application Ser. No. 11/643,871 filed Dec. 22, 2006, issued as U.S. Pat. No. 7,863,662, which claims benefit to Japanese Patent Application Nos. JP2005-370945, JP2005-370946 and JP 2005-370947 all filed Dec. 22, 2005. The above-noted applications are incorporated herein by reference to their entirety.

BACKGROUND OF THE INVENTION

1. Field of the Invention

The present invention relates to a capacitor to be incorporated in a wiring substrate, a method for manufacturing the capacitor, and the wiring substrate.

2. Description of the Related Art

In accordance with the progress of an integrated circuit technology of recent years, the actions of a semiconductor chip becomes higher and higher in speeds. Accordingly, noises may be superposed on power source lines or the like to cause malfunctions. Thus, the noises are removed by mounting a capacitor on the upper face or lower face of a wiring substrate to mount the semiconductor chip.

In the aforementioned method, however, after completion of the wiring substrate, it is necessary to mount the capacitor separately, so that the process number increases. It is also necessary to retain such an area in advance as to mount the capacitor on the wiring substrate, so that the degree of freedom for other electronic parts is lowered. Due to the restrictions by other wires, the wiring distance between the capacitor and the semiconductor chip is elongated to increase the wiring resistance or inductance.

With these in mind, it has been proposed (as referred to JP-A-2005-39243, for example) to incorporate the capacitor in the wiring substrate. Here, the capacitor may be incorporated in the opening of a core substrate forming the core of the wiring substrate. In this case, the gap between the core substrate and the capacitor is filled with a resin filler so as to fix the capacitor in the core substrate. Since, however, the side faces of the capacitor are made mainly from ceramics, the adhesion properties between the capacitor and the resin filler are so low that the reliability cannot be sufficiently retained.

Moreover, a thermal stress is concentrated either in the resin filler between the core substrate in the wiring substrate and the capacitor or in the insulating layers near the capacitor in the wiring substrate by the heat which is generated at the action time of the semiconductor chip. As a result, cracks may be caused in the resin filler or the insulating layers.

Against these problems, it has been proposed (as referred to JP-A-2004-172305, for example) to form rounded portions having a radius of curvature of 0.01 to 0.1 mm between the side faces and the upper and lower faces of the capacitor. Since, however, the rounded portions are formed by a polishing method after the capacitor was sintered, the dielectric layers after sintered are worked to require long working time-periods and high costs.

The capacitor to be incorporated in the wiring substrate, as described in JP-A-2005-39243, is manufactured by forming a laminate including a plurality of dielectric layers laminated and internal electrode layers arranged between the dielectric layers, and by sintering the laminate. However, a warpage may occur at the sintering time. Therefore, it has been proposed to prepare an assembly of the capacitor and to divide the assembly into capacitors after sintered.

Here in the capacitor to be incorporated in the wiring substrate, it is necessary to form external electrode layers to be electrically connected with the wiring lines formed on the wiring substrate. On these external electrode layers, there may be formed plated external electrode layers for improving the adhesion properties with the insulating layers of the buildup layers, and plated films for preventing the oxidation of the external electrode layers. These plated films are formed at present by an electroless plating method.

However, it takes a long time to form the plated films by the electroless plating method. In case the distance between the external electrode layers is so short as 150 μm, the external electrode layers may be connected by the plated films and may be electrically shorted.

Thus, it has been proposed to form the plated films not by the electroless plating method but by an electrolytic plating method. In case, however, the aforementioned capacitor assembly is to be manufactured, the break trenches for dividing the capacitor have to be formed in the assembly. Between the adjoining capacitors, therefore, the external electrode layers are spaced from each other across the break trenches. When the plated films are to be formed by the electrolytic plating method, therefore, the electrodes or the like have to be brought into contact for every external electrode layers so that the plated films cannot be efficiently formed by the electrolytic plating method.

There has been disclosed a technique (e.g., JP-A-61-276396), in which the boundaries between the body having the wiring pattern and a disposal plate are perforated, and in which the wiring pattern is electrolytically plated. However, the perforations in this technique are just for dividing the body and the disposal plate and have no relation to the electrolytic plating method.

3. Problems to be Solved by the Invention

The present invention has been proposed to solve the aforementioned problems. Specifically, the invention provides a capacitor to be incorporated in a wiring substrate and capable of improving the adhesion properties with the wiring substrate, a wiring substrate having a reliability sufficiently retained, a capacitor manufacturing method capable of shortening the working time and reducing the working cost for forming notched holes, a capacitor suited to be incorporated in the wiring substrate, a method for manufacturing the capacitor to be incorporated in the wiring substrate and for forming plated films efficiently on external electrode layers by an electrolytic plating method, and a capacitor suited for incorporating the wiring substrate.

SUMMARY OF THE INVENTION

According to one mode of the invention, there is provided a wiring substrate incorporating a capacitor comprising a capacitor body including a plurality of dielectric layers and internal electrode layers arranged between the different dielectric layers. The wiring substrate is characterized in that the capacitor body has, in at least one side face, recesses extending in the thickness direction (the direction from the first principal face to the second principal face, or the direction from the second principal face to the first principal face) of the capacitor body from at least one of a first principal face of the capacitor body and a second principal face positioned on the side opposite to the first principal face.

According to a second mode of the invention, the wiring substrate is characterized by incorporating the capacitor to be incorporated therein.

According to the capacitor to be incorporated in the wiring substrate in accordance with one mode of the invention, the recesses extending in the thickness direction of the capacitor body from at least one principal face are formed in at least one of the side faces of the capacitor body. When the capacitor is to be incorporated in the actual wiring substrate, the contact area with the resin material for being adhered to fix the core substrate is enlarged by filling the resin material into the recesses. As is result, it is possible to improve the adhesion properties to the core substrate. Therefore, it is retain the reliability of the wiring substrate sufficiently in the second mode of the invention.

According to a third mode of the invention, there is provided a method for manufacturing a capacitor including a plurality of dielectric layers and a plurality of internal electrode layers arranged between the different ones of the dielectric layers. The method is characterized by comprising: the step of forming an unsintered laminate including a plurality of ceramic green sheets laminated to become the dielectric layers, and a plurality internal electrode patterns arranged between the different ones of the ceramic green sheets and adapted to become the internal electrode layers; the step of forming notched holes in the outer periphery of such a portion in the laminate as to become the capacitor; and the step of sintering the laminate having the notched holes formed.

According to a fourth mode of the invention, there is provided a capacitor comprising a plurality of dielectric layers, and a plurality of internal electrode layers arranged between the different ones of the dielectric layers. The capacitor is characterized: in that either chamfered portions having a chamfer dimension of 0.6 mm or more and rounded portions having a radius of curvature of 0.6 mm or more are formed in at least one corner portion of the outer periphery of the capacitor; in that the capacitor has a warpage of less than 100 μm; and in that the dielectric layers in the chamfered portions or the rounded portions have chipping quantities of 0.5 mm or less in their length, width and depth.

According to the capacitor manufacturing method of the third mode of the invention, the notched holes are formed in the outer periphery of the portion to become the capacitor in the laminate before sintered, it is possible to shorten the working time period at the time of forming the notched holes and to lower the working cost. According to the capacitor of the fourth mode of the invention, it is possible to provide a capacitor suited to be incorporated in the wiring substrate.

According to a fifth mode of the invention, there is provided a method for manufacturing a capacitor to be incorporated in a wiring substrate and comprising a capacitor body including a plurality of dielectric layers and a plurality of internal electrode layers, arranged between the different ones of the dielectric layers, and external electrode layers formed on the capacitor body. The method is characterized by comprising: the step of forming a laminate including a plurality of ceramic green sheets containing a plurality of capacitor forming areas, which are to be sintered to become the dielectric layers, and a plurality of internal electrode patterns arranged in the individual ones of the capacitor forming areas and between the different ones of the ceramic green sheets, which are to be sintered to become the internal electrode layers; the step of forming external electrode patterns extending on the laminate and across two or more of the capacitor forming areas, and electrically connected with the internal electrode patterns in the individual ones of the capacitor forming areas, which are to be sintered to become the external electrode layers; the step of forming first break trenches extending through the external electrode patterns, in the laminate having the external electrode patterns formed, and extending along at least portions of the boundary of the individual ones of the capacitor forming areas; the step of sintering the laminate having the external electrode patterns formed, after the first break trenches were formed; the step of forming plated films electrolytically on the external electrode layers, after the laminate having the external electrode patterns formed was sintered, by feeding an electric current to the external electrode layers; and the step of dividing the laminate having the plated films formed on the external electrode layers, along the first break trenches.

According to a sixth mode of the invention, there is provided a capacitor to be incorporated in a wiring substrate, comprising: a capacitor body including a plurality of dielectric layers, first internal electrode layers arranged between the dielectric layers, and second internal electrode layers provided so that the first internal electrode layers and the second internal electrode layers are alternately arranged in the laminated direction of the dielectric layers through the dielectric layers; first external electrode layers formed on the capacitor body and electrically connected with the first internal electrode layers; second external electrode layers formed on the capacitor body in substantially the same plane as the first external electrode layers, spaced from the first external electrode layers, and electrically connected with the second internal electrode layers; and plated films electrolytically formed on the first external electrode layers and the second external electrode layers. The capacitor is characterized: in that the capacitor has a warpage of less than 100 μm; and in that the plated films formed on the first external electrode layers and the plated films formed on the second external electrode layers are spaced at portions, in which the distance between the first external electrode layers and the second external electrode layers is 30 to 300 μm.

According to the fifth mode of the invention, the perforated first break trenches extending through the external electrode layers are formed in the laminate having the external electrode layers formed. Therefore, it is possible to provide a method for manufacturing the capacitor to be incorporated in the wiring substrate, which method can form the plated films efficiently on the external electrode layers by the electrolytic plating method.

According to the sixth mode of the invention, the warpage of the capacitor to be incorporated in the wiring substrate is less than 100 μm, and the first plated films and the second plated films are spaced at portions where the distance between the first external electrode layers and the second external electrode layers are spaced at the distance of 30 to 300 μm. Therefore, it is possible to provide a capacitor to be incorporated in the wiring substrate, which is suited to be incorporated in the wiring substrate.

DETAILED DESCRIPTION OF THE INVENTION

First Embodiment

Figure 1A:
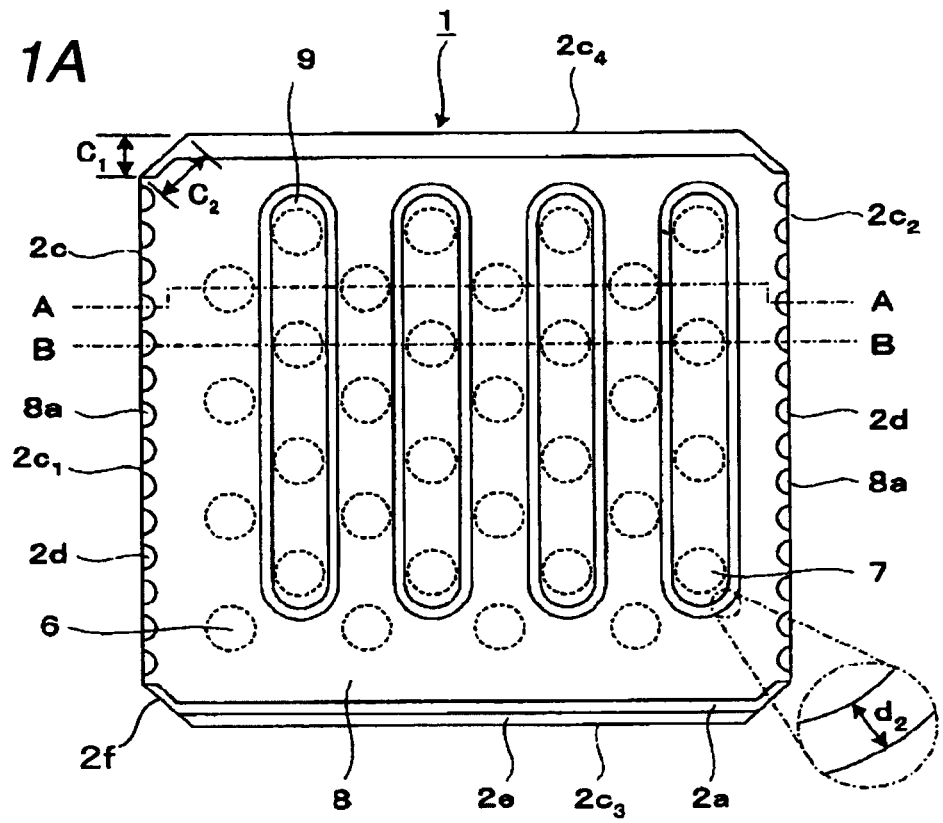
FIG. 1A and FIG. 1B are schematic top plan views of a capacitor to be incorporated in a wiring substrate in accordance with first, fifth and seventh embodiments.
Figure 1B:
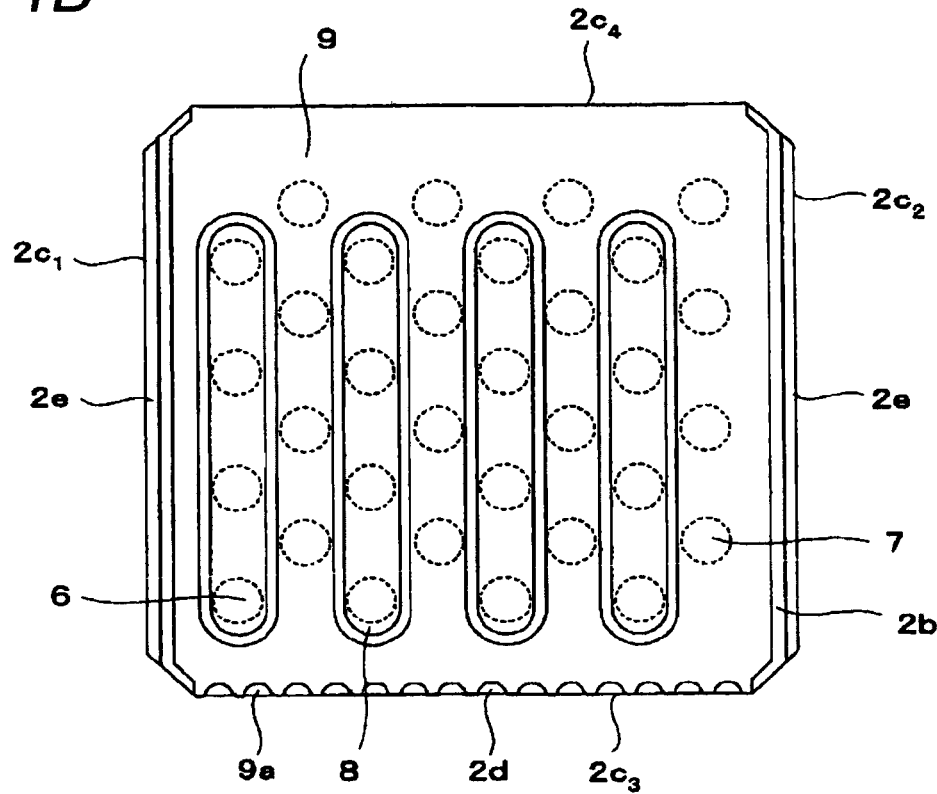
Figure 2A:
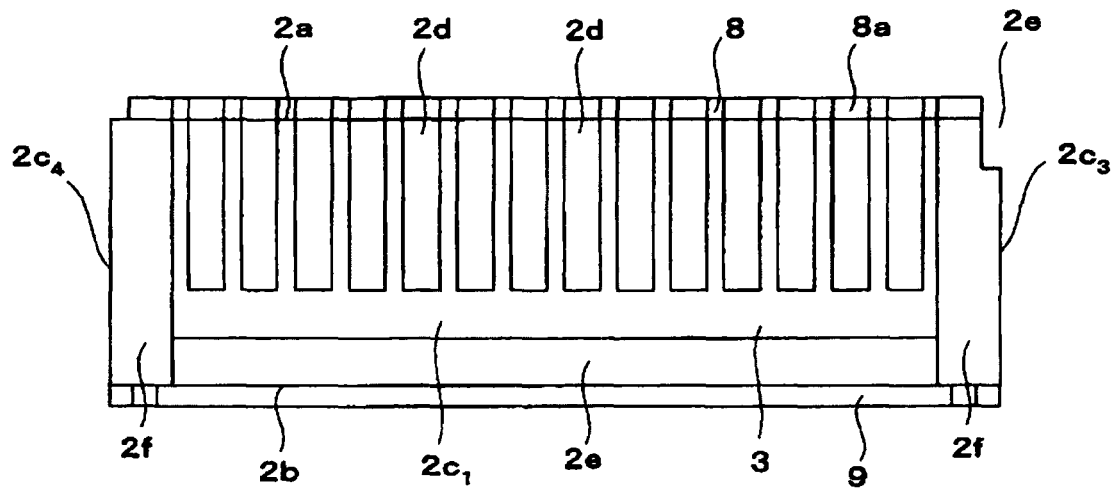
FIG. 2A and FIG. 2B are schematic side elevations of the capacitor to be incorporated in the wiring substrate in accordance with the first, fifth and seventh embodiment.
Figure 2B:
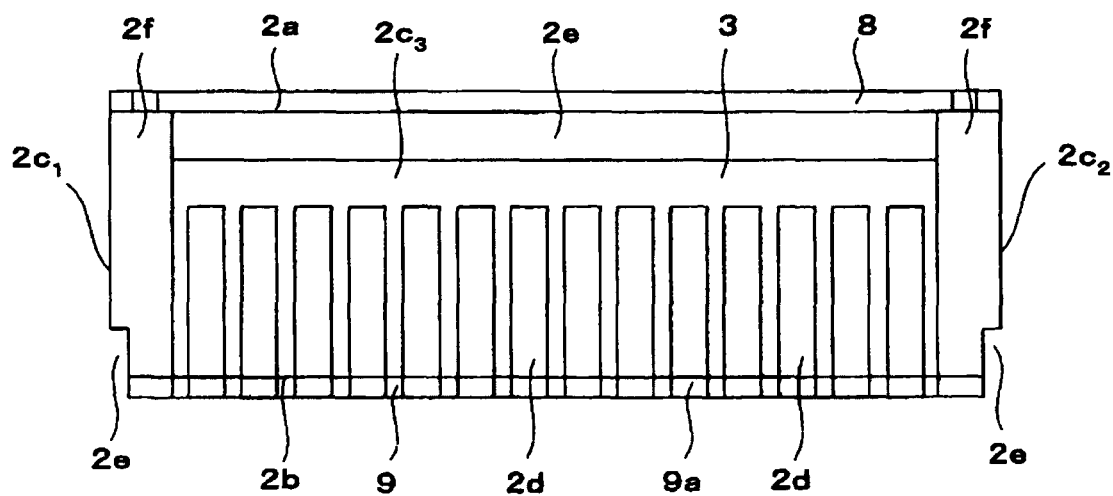
Figure 3A:
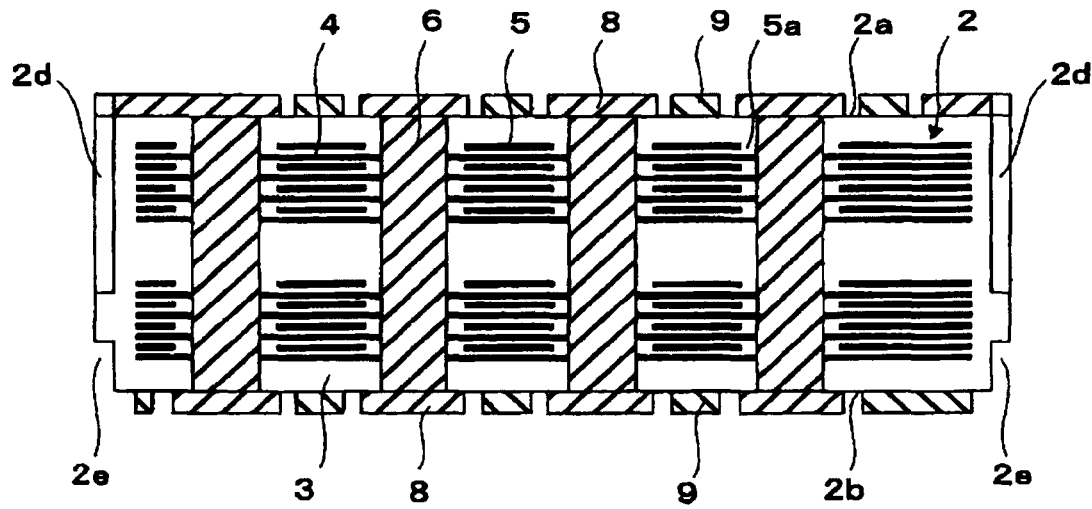
FIG. 3A is a schematic longitudinal section of the capacitor to be incorporated in the wiring substrate, when cut along line A-A of FIG. 1A.
Figure 3B:
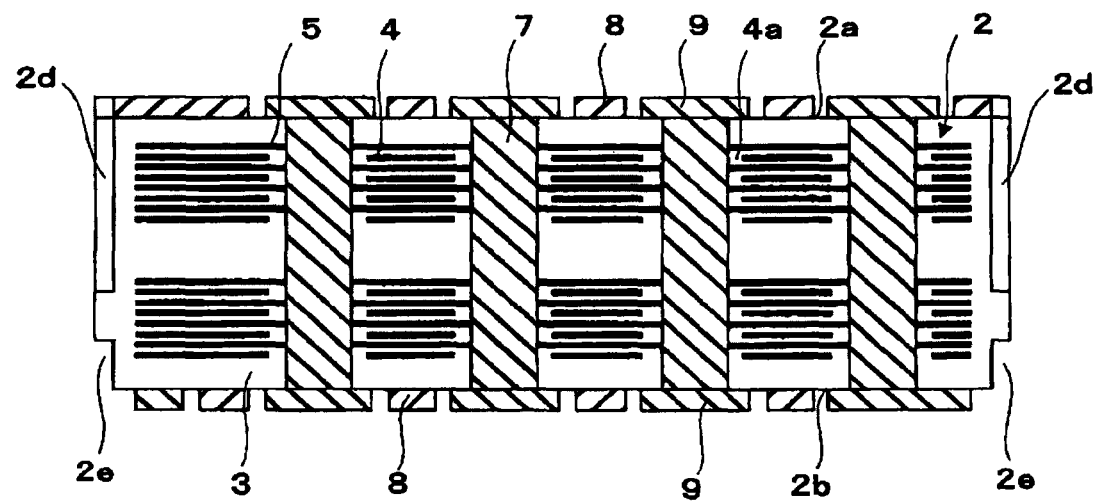
FIG. 3B is a schematic longitudinal section of the capacitor to be incorporated in the wiring substrate, when cut along line B-B in FIG. 1A.
Figure 4:
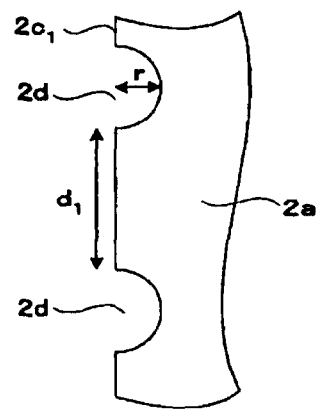
FIG. 4 is enlarged schematic view of the vicinity of the outer periphery of a capacitor body according to the first, fifth and seventh embodiments.

A first embodiment of the invention is described in the following with reference to the accompanying drawings. FIG. 1A and FIG. 1B are schematic top plan views of a capacitor to be incorporated in a wiring substrate in accordance with the embodiment and FIG. 2A and FIG. 2B are schematic side elevations of the capacitor to be incorporated in the wiring substrate in accordance with the embodiment. FIG. 3A is a schematic longitudinal section of the capacitor to be incorporated in the wiring substrate, when cut along line A-A of FIG. 1A; FIG. 3B is a schematic longitudinal section, of the capacitor to be incorporated in the wiring substrate, when cut along line B-B of FIG. 1A; and FIG. 4 is enlarged schematic view of the vicinity of the outer periphery of a capacitor body according to the embodiment.

A capacitor 1 to be incorporated in the wiring substrate (as will be shortly called the "capacitor"), as shown in FIG. 1A to FIG. 3B, is a laminated capacitor formed into a rectangular parallelepiped shape and having a warpage less than 100 μm. The capacitor 1 has a capacitor body 2 forming the core of the capacitor 1. The capacitor body 2 is constituted to include a plurality of dielectric layers 3 laminated in the vertical direction, and a plurality of internal electrode layers 4 (i.e., first internal electrode layers) and a plurality of internal electrode layers 5 (i.e., second internal electrode layers) arranged between the dielectric layers 3.

The dielectric layers 3 are made from dielectric ceramics such as barium titanate, lead titanate and strontium titanate. The dielectric layers 3 can also be made from low-temperature sintered ceramics such as glass ceramics prepared by adding an inorganic ceramic filler such as alumina to borosilicate glass or lead borosilicate glass, or high-temperature sintered ceramics such as alumina, aluminum nitride, boron nitride, silicon carbide and silicon nitride, in accordance with the required characteristics.

The internal electrode layers 4 and 5 are alternately arranged in the laminating direction of the dielectric layers 3 through the dielectric layers 3. The internal electrode layers 4 and the internal electrode layers 5 are electrically insulated from each other by the dielectric layers 3. The total number of the internal electrode layers 4 and 5 is about 100.

The internal electrode layers 4 and 5 are made mainly from a conductive material such as Ni, and contain a ceramic material like that making the dielectric layers 3. The adhesion properties between the dielectric layers 3 and the internal electrode layers 4 and 5 can be enhanced by containing those ceramic materials individually in the internal electrode layers 4 and 5. Here, the internal electrode layers 4 and 5 need not contain such ceramic material. The internal electrode layers 4 and 5 have a thickness of 2 μm or less.

The appearance of the capacitor body 2 is constituted to include a first principal face 2a positioned in the thickness direction of the capacitor body 2, a second principal face 2b positioned on the side opposite to the first principal face 2a, and an outer periphery 2c positioned between the first principal face 2a and the second principal face 2b. The outer periphery 2c is composed mainly of a first side face 2c1, a second side face 2c2 positioned on the side opposite (opposed) to the side face 2c1, a third side face 2c3 adjacent to the side face 2c1 and the side face 2c2, and a fourth side face 2c4 positioned on the side opposite (opposed) to the side face 2c3 and adjacent to the side face 2c1 and the side face 2c2. The side faces 2c1, 2c2, 2c3 and 2c4 are made exclusively of the dielectric layers 3. Here, the side faces of later-described recesses 2d and notches 2e in the side faces 2c1, 2c2 and 2c3 are also made exclusively of the dielectric layers 3.

Individually in the side faces 2c1, 2c2 and 2c3, as shown in FIG. 2A and FIG. 2B, there are formed the semicylindrical recesses 2d extending, in the thickness direction of the capacitor body 2, and the notches 2e extending in the outer peripheral direction of the capacitor body 2. In the side faces 2c1, 2c2 and 2c3, there may be formed ridges extending in the thickness direction of the capacitor body 2 in place of or together with the recesses 2d. Moreover, the recesses 2d and the notches 2c may also be formed in the side face 2c4.

The recesses 2d are formed in plurality at a predetermined gap along the outer periphery of the capacitor body 2. It is desired that the recesses 2d in the side faces 2c1 and 2c2 are formed from the first principal face 2a to positions of 20% or more and 70% or less of the thickness of the capacitor body 2, and that the recesses 2d in the side face 2c3 are formed from the second principal face 2b to positions of 20% or more and 70% or less of the thickness of the capacitor body 2. These ranges are desired because the range of 20% or more can improve the adhesion properties sufficiently with the later-described resin filler 42 and because the range of 70% or less can reduce the cracking or chipping of the recesses 2d, for example, at the time the capacitor 1 is transported.

The recesses 2d shown in FIG. 4 are desired to have a radius of 30 to 75 μm. This is because the resin filler 42 cannot sufficiently flow, if less than 30 μm, to make the adhesion properties insufficient or to lower the reliability with cavities, and because the area of the internal electrodes becomes insufficient, if more than 75 μm, to cause shortage of the capacity. Moreover, the recesses 2d need not be semicylindrical. The notches 2e is formed from one end edge to the other of each of the side faces 2c1, 2c2 and 2c3. For example, the notch 2e of the side face 2c3 is formed from the end edge on the side of the side face 2c1 to the end edge on the side of the side face 2c2. In other words, the notches 2e are formed to extend in the direction (outer peripheral direction) of the end edge of the side of the side face 2c2 from the end edge of the side of the side face 2c1.

Moreover, it is preferred that the distance d1 between the recesses 2d, as shown in FIG. 4, is more than 0 μm and less than 500 μm. This is because the plated film explained below cannot be formed in case the distance d1 is 0 μm, and it may be difficult to divide the laminate 29 for each of the capacitor forming areas R in case the distance d1 is 500 μm or more.

In the side face 2c1, as shown in FIG. 2A, the recesses 2d are formed in the side of the first principal face 2a (extended in the thickness direction from the first principal face 2a), and the notches 2e are formed in the side of the second principal face 2b. The side face 2c2 is similar to the side face 2c1, although not shown. In the side face 2c2, the recesses 2d are formed in the side of the second principal face 2b (extended in the thickness direction from the second principal face 2b), and the notches 2e are formed in the side of the first principal face 2a.

At the four corner portions of the outer periphery 2c of the capacitor body 2, as shown in FIG. 1A, there are formed flat-shaped chamfered portions 2f having a chamfer dimension C1 of 0.6 mm or more. The chamfer dimension C1 is a length shown in FIG. 1A. The chamfer dimension C1 may be actually measured, but could be determined from a C face length C2. This C face length C2 is the length of a segment, as shown in FIG. 1A, and the chamfer dimension C1 is the value obtained by dividing the C face length C2 by $\sqrt{2}$.

It is desired from the viewpoint of the capacitor manufacture that the chamfer dimension C1 is 0.8 mm or more and 1.2 mm or less. Here, a round portion having a radius of curvature of 0.6 mm or more may be formed in place of or together with the chamfered portions 2f on at least one corner of the outer periphery 2c of the capacitor body 2. In this case, it is desired from the viewpoint of the capacitor manufacture that the radius of curvature of the rounded portion is 0.8 mm or more and 1.2 mm or less.

In the capacitor body 2, there are formed a plurality of via conductors 6 (first via conductors) and a plurality of via conductors 7 (second via conductors), which extend through the capacitor body 2 from the first principal face 2a to the second principal face 2b. Here, the via conductors 6 and 7 may extend through at least one dielectric layer 3 in the thickness direction of the dielectric layers 3 but need not always extend through the capacitor body 2.

The via conductors 6 are connected at their side faces with the internal electrode layers 4, and the via conductors 7 are connected at their side faces with the internal electrode layers 5. In the internal electrode layers 5, as shown in FIG. 3A, gap holes 5a (hole portions) are formed at areas, through which the via conductors 6 extend. The internal electrode layers 5 and the via conductors 6 are electrically insulated from each other. Likewise, as shown in FIG. 3B, gap holes 4a (hole portions) are formed at areas, through which the via conductors 7 extend. The internal electrode layers 4 and the via conductors 7 are electrically insulated from each other. Here, the dielectric layers 3 are interposed between the internal electrode layers 4 and 5 and the via conductors 6 and 7 in the gap holes 4a and 5a.

The via conductors 6 and 7 are made mainly from a conductive material such as Ni and Cu, and contain a ceramic material similar to that making the dielectric layers 3. The adhesion properties of the dielectric layers 3 and the via conductors 6 and 7 can be enhanced by containing such ceramic material individually in the via conductors 6 and 7. Here, the via conductors 6 and 7 may not contain such ceramic material.

On the first principal face 2a and the second principal face 2b, there are individually formed external electrode layers 8 (first external electrode layers) and external electrode layers 9 (second external electrode layers), which are used as the power feeding terminals or ground connecting terminals. Here, the external electrode layers 8 and 9 need not be formed on both the first principal face 2a and the second principal face 2b of the capacitor body 2, but may be formed on either the first principal face 2a or the second principal face 2b.

On the side of the first principal face 2a, as shown in FIG. 1A, the external electrode layer 8 is formed to enclose the island-shaped external electrode layers 9. On the side of the second principal face 2b, as shown in FIG. 1B, the external electrode layer 9 is formed to enclose the island-shaped external electrode layers 8.

The external electrode layer 8 is formed on the via conductors 6 and is electrically connected with the via conductors 6. On the other hand, the external electrode layer 9 is formed on the via conductors 7 and is electrically connected with the via conductors 7.

On either the side of the first principal face 2a or the side of the principal face 2b, the external electrode layers 8 and the external electrode layers 9 are spaced from each other and are electrically insulated from each other. The distance d2 between the external electrode layers 8 and the external electrode layers 9 is preferred to be smaller if they retain the insulation, and is 150 μm at some portion.

On the side of the first principal face 2a, the external electrode layers 8 and 9 have a total surface area of 45% or more and 90% or less of the area of the first principal face 2a. On the side of the second principal face 2b, the external electrode layers 8 and 9 have a total surface area of 45% or more and 90% or less of the area of the second principal face 2b. By thus setting the total surface area of the external electrode layers 8 and 9 within that range with respect to the area of the first principal face 2a and the second principal face 2b, the exposed area of the dielectric layers 3 in the first principal face 2a and the second principal face 2b can be reduced. As a result, it is possible to improve the adhesion properties between the capacitor 1 and the later-described insulating layers 44 and 48 can be improved.

On the side of the first principal face 2a, the external electrode layer 8 is formed from the end of the side of the side face 2c1 to the end of the side of the side face 2c2. In the external electrode layer 8, there are formed recesses 8a, which communicate with the recesses 2d of the side faces 2c1 and 2c2. The recesses 8a are made to have the same radius as the radius r of the recesses 2d and are made concentric to the recesses 2d. On the side of the second principal face 2b, moreover, the external electrode layer 9 is formed from the end of the side of the side face 2c3 to the end of the side of the side face 2c4. In the external electrode layer 9, there are formed recesses 9a, which communicate with the recesses 2d of the side face 263. The recesses 9a are made to have the same radius as the radius r of the recesses 2d and are made concentric to the recesses 2d.

On the side of the first principal face 2a, the external electrode layer 8 may be formed from the end of the side of the side face 2c3 to the end of the side of the side face 2c4. In this case, the first principal face 2a can be flattened to improve the adhesion properties with the later-described insulating layers 44 and 48 and so on and to form stable via conductors 61 and 62 and so on. On the side of the second, principal face 2b, the external electrode layer 9 may also be formed from the end of the side of the side face 2c1 to the end of the side of the side face 2c2.

The external electrode layers 8 and 9 are made mainly from a conductive material such as Ni, and contain a ceramic material like that making the dielectric layers 3. The adhesion properties between the dielectric layers 3 and the external electrode layers 8 and 9 can be enhanced by containing those ceramic materials individually in the external electrode layers 8 and 9. Here, the external electrode layers 8 and 9 need not contain such ceramic material.

On the surfaces of the external electrode layers 8 and 9, there are formed first plated films (although not shown) for improving the adhesion properties with the later-described insulating layers 44 and 48 and via conductors 61 and 62 and so on. The first plated films also have a function to prevent oxidation of the external electrode layers 8 and 9. The first plated films are formed by an electrolytic plating method. Here, the first plated film may also be formed by an electroless plating method. It is preferred that the first plated film is made from a conductive material such as Au and Cu. It is further preferred for improving the adhesion properties with the insulating layer 44 that the outermost surface is made from Cu.

Between the external electrode layers 8 and 9 and the first plated film, there is formed a second plated film (although not shown) for suppressing the reduction of the adhesion properties with the external electrode layers 8 and 9 and the first plated film. When the ceramic material is contained in the external electrode layers 8 and 9, as described above, the ceramic material may be exposed to the surfaces of the external electrode layers 8 and 9, thereby to lower the adhesion properties between the external electrode layers 8 and 9 and the first plated film. In order to the adhesion properties from being lowered, the second plated film is formed. This second plated film is formed by the electrolytic plating method. Here, the second plated film may also be formed by the electroless plating method, if it is formed by the plating method.

It is preferred that the second plated film is made from the same conductive material as the major component of the external electrode layers 8 and 9. However, the second plated film need not be formed, in case the external electrode layers 8 and 9 containing a ceramic material added can be directly plated to have high adhesion properties.

Figure 5A:
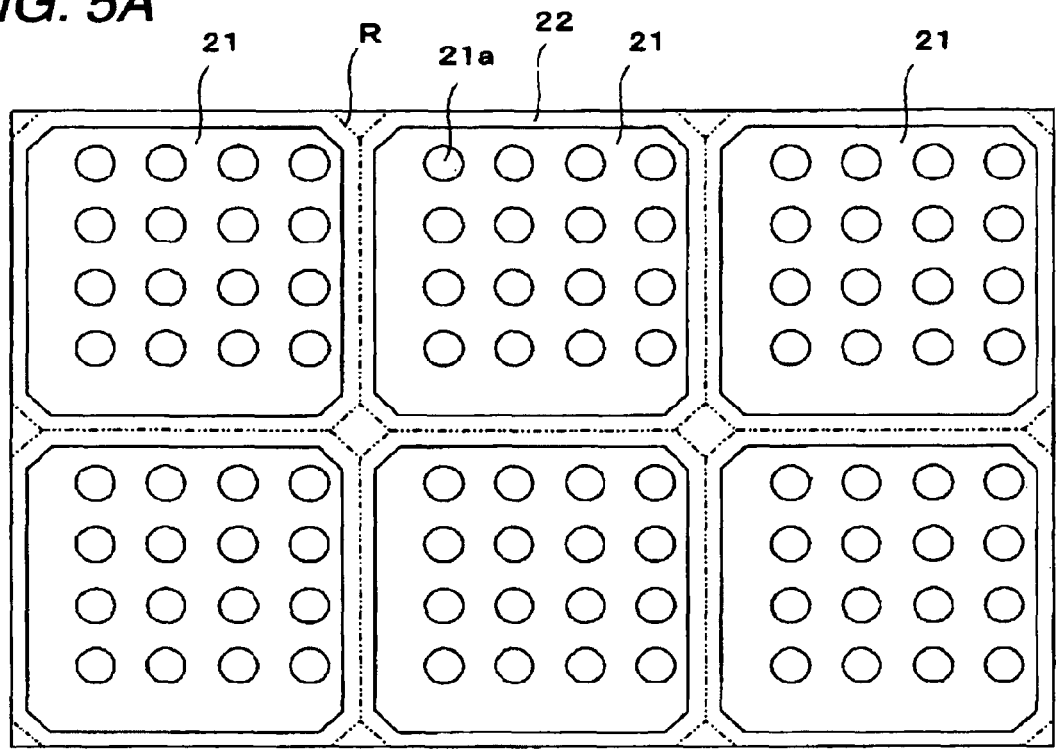
FIG. 5A and FIG. 5B are schematic top plan views of ceramic green sheets having internal electrode patterns formed according to the first, fifth and seventh embodiments.
Figure 5B:
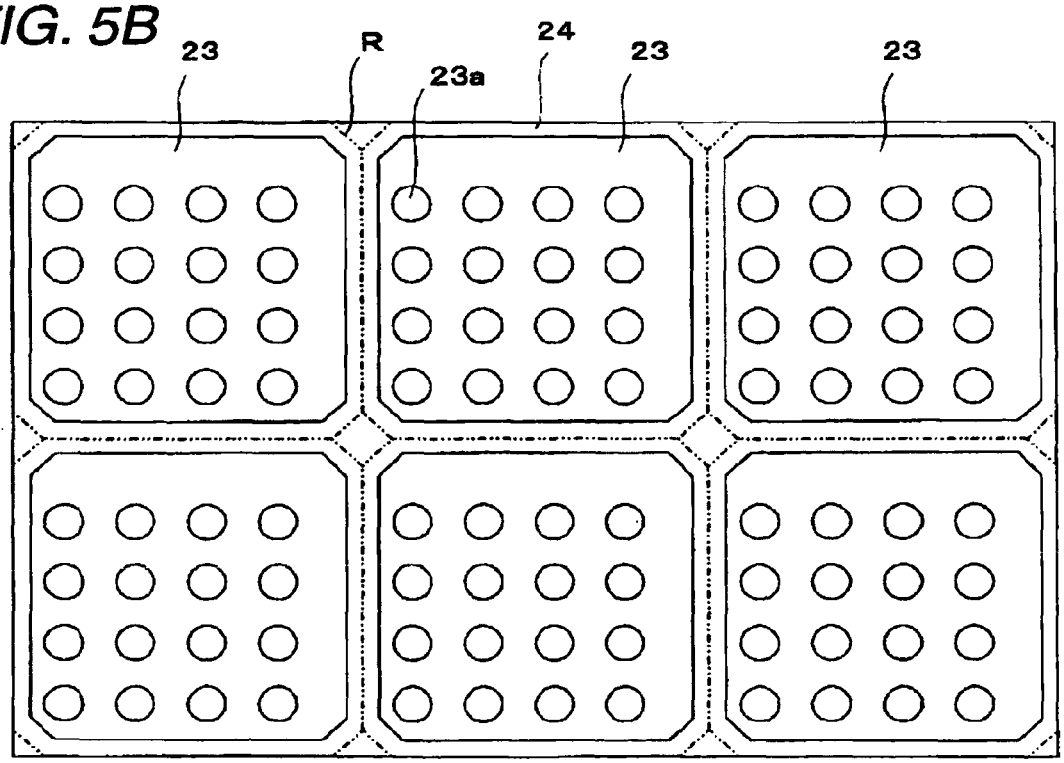

The capacitor 1 can be manufactured by the following procedure, for example. FIG. 5A and FIG. 5B are schematic top plan views of ceramic green sheets having internal electrode patterns formed according to the embodiment, and FIG. 6A, FIG. 6B, FIG. 7B, FIG. 8B, FIG. 9B and FIG. 10B are schematic longitudinal sections of a laminate according to the embodiment. FIG. 7A, FIG. 8A, FIG. 9A, FIG. 10A and FIG. 11 are schematic top plan views of the laminate according to the embodiment.

At first, a plurality of ceramic green sheets 22 having an internal electrode pattern 21 formed thereon, and ceramic green sheets 24 having an internal electrode pattern 23 formed thereon (FIG. 5A and FIG. 5B). Here, the internal electrode patterns 21 and 23 are those before the internal electrode layers 4 and 5 are sintered, and the ceramic green sheets 22 and 24 are those before the dielectric layers 3 are sintered.

The internal electrode patterns 21 and 23 are individually formed in capacitor forming areas R. The capacitor forming areas R form the capacitor 1 and exist in plurality in the ceramic green sheets 22 and 24. In the drawings, the capacitor forming areas R are designated by double-dotted lines. The internal electrode patterns 21 and 23 are made from a conductor paste, for example.

The internal electrode patterns 21 and 23 are formed in the capacitor forming areas R by the screen-printing method, for example. Moreover, the internal electrode patterns 21 and 23 have gap holes 21a and 23a (hole portions) to become gap holes 4a and 5a, after sintered.

Figure 6A:
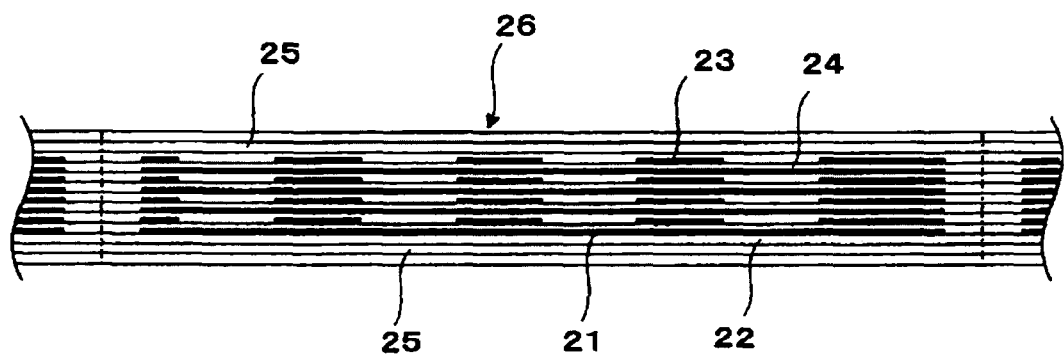
FIG. 6A and FIG. 6B are schematic longitudinal sections of a laminate according to the first, fifth and seventh embodiments.

There are also prepared two cover layers 25, as shown in FIG. 6A. The cover layers 25 are formed by laminating a predetermined number of dielectric layers not having the internal electrode patterns 21 and 23 formed.

After the ceramic green sheets 22 and 24 and the cover layer 25 were prepared, the ceramic green sheets 22 and the ceramic green sheets 24 are alternately laminated on the cover layer 25, and another cover layer 25 is further laminated. After this, these layers are pressurized to form a laminate 26 (FIG. 6A).

Figure 6B:
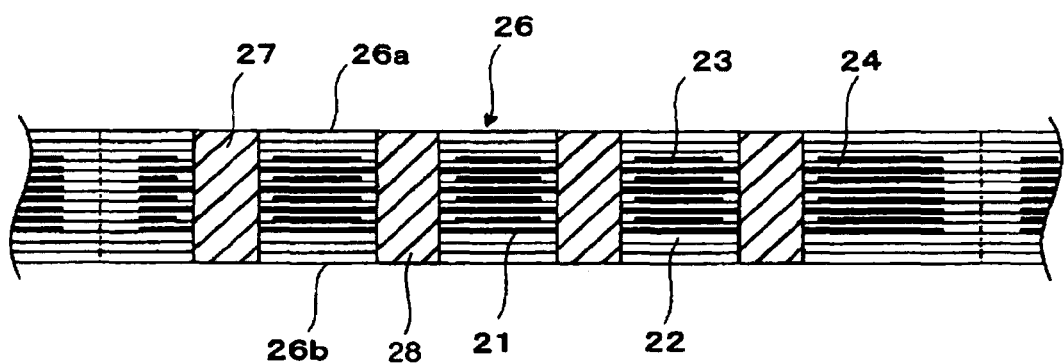

After this laminate 26 was formed, there are formed via holes, which extend from a principal face 26a to a principal face 26b of the laminate 26. A conductive paste is injected into the via holes to form via conductor pastes 27 and 28 (FIG. 6B). Here, the via conductor pastes 27 and 28 are those before the via conductors 6, 7 are sintered.

Figure 7A:
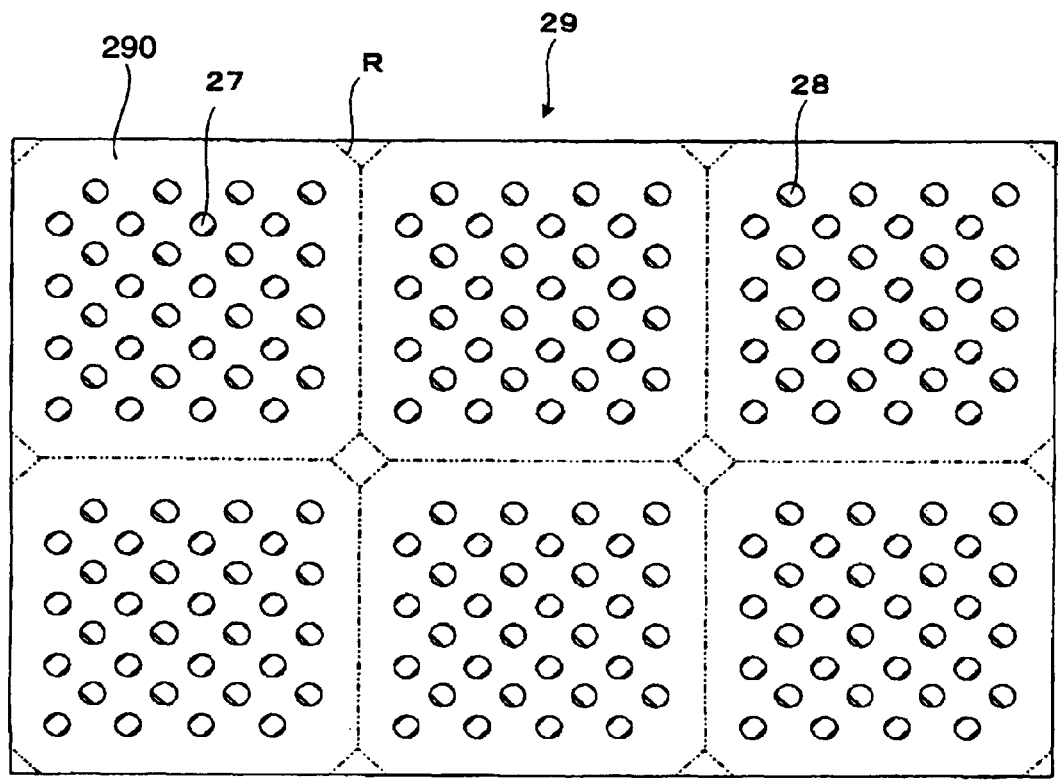
FIG. 7A is a schematic top plan view of a laminate according to the first, fifth and seventh embodiments.
Figure 7B:
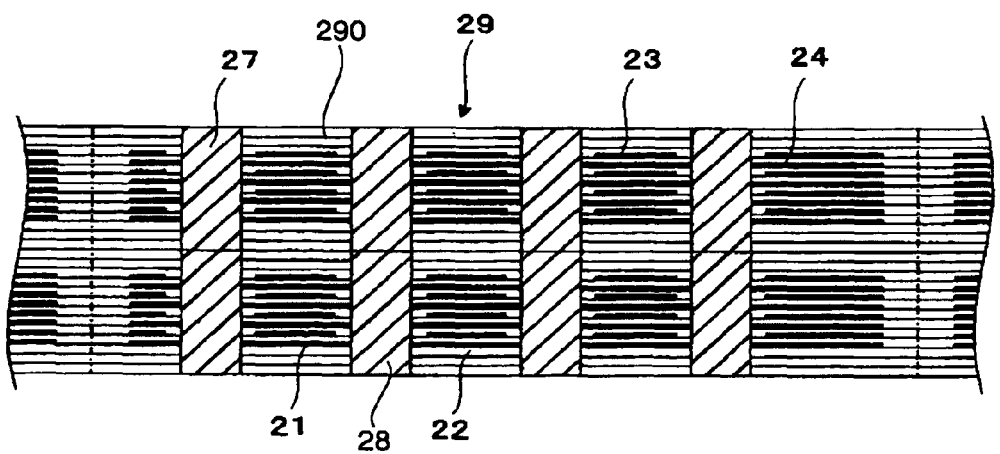
FIG. 7B is a schematic longitudinal section of the laminate according to the first, fifth and seventh embodiments.

Next, over the laminate 26 having the via conductor pastes 27 and 28 formed, the laminate 26 formed by a similar procedure is laid to provide communication between the via conductor pastes 27 and between the via conductor pastes 28, and these components are pressurized to form a laminate 29 (FIG. 7A and FIG. 7B).

Figure 8A:
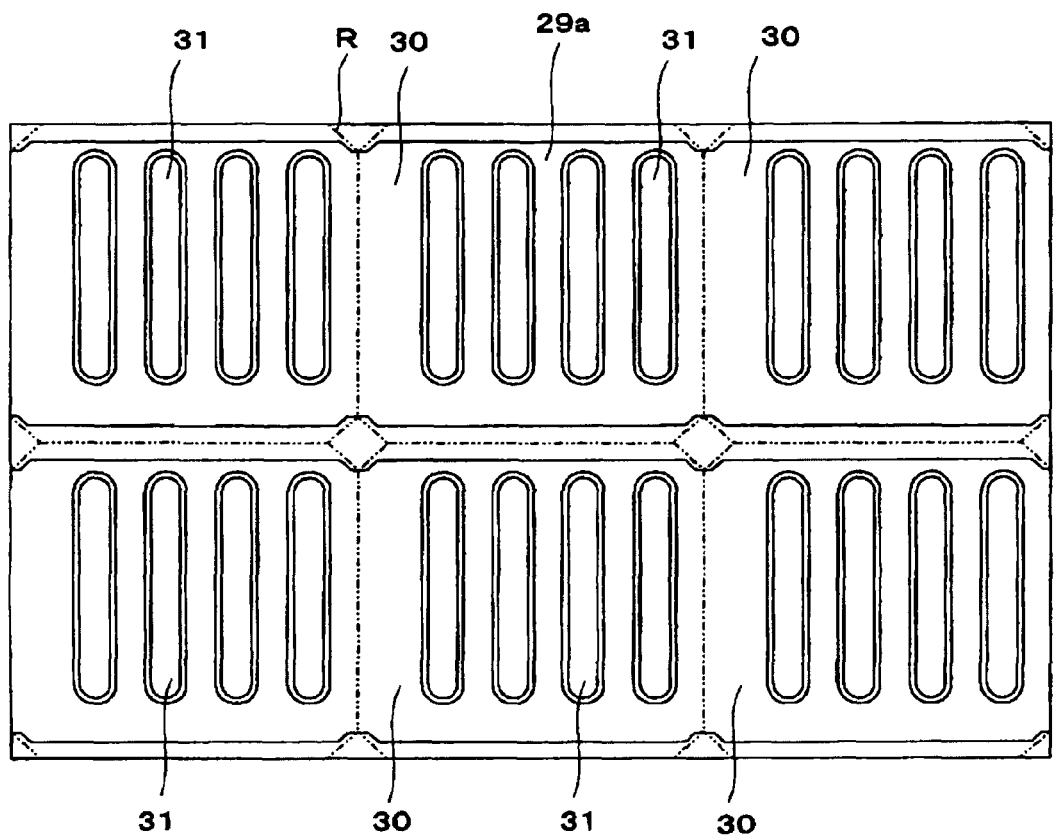
FIG. 8A is a schematic top plan view of a laminate according to the first, fifth and seventh embodiments.
Figure 8B:
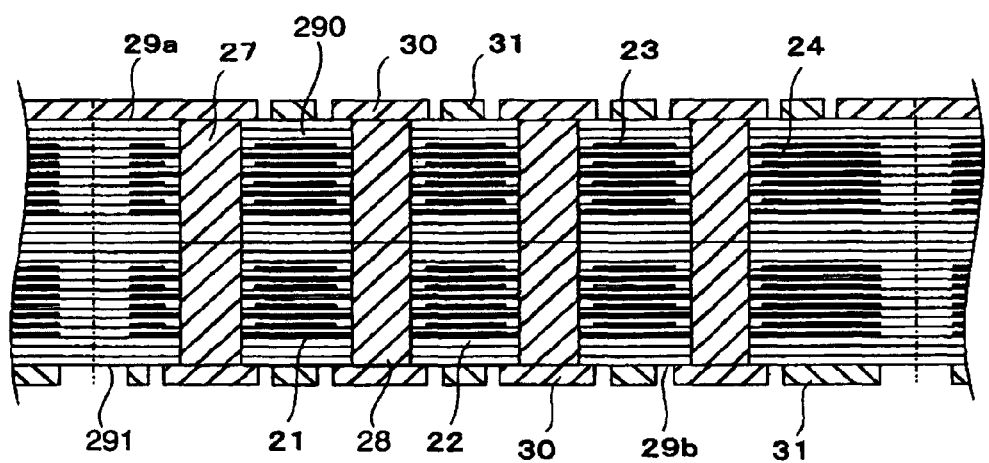
FIG. 8B is a schematic longitudinal section of the laminate according to the first, fifth and seventh embodiments.

After this, in a principal face 29a of the laminate 29 and in a principal face 29b on the side opposite to the principal face 29a, respectively, there are formed by a screen printing method or the like external electrode patterns 30, which are connected with the via conductor pastes 27 in the capacitor forming areas R, and external electrode patterns 31 which are connected with the via conductor pastes 28 in the capacitor forming areas R (FIG. 8A and FIG. 8B). Here, the external electrode patterns 30 and 31 are those before the external electrode layers 8 and 9 are sintered.

The external electrode patterns 30 on the side of the principal face 29a are formed across the capacitor forming areas R, and external electrode patterns 31 on the side of the principal face 29b are formed across the capacitor forming areas R. In this embodiment, the external electrode patterns 30 on the side of the principal face 29a are formed across the capacitor forming areas R arranged in the longitudinal direction of the principal face 29a, and the external electrode patterns 31 on the side of the principal face 29b are formed across the capacitor forming areas R arranged in the transverse direction of the principal face 29b.

Figure 9A:
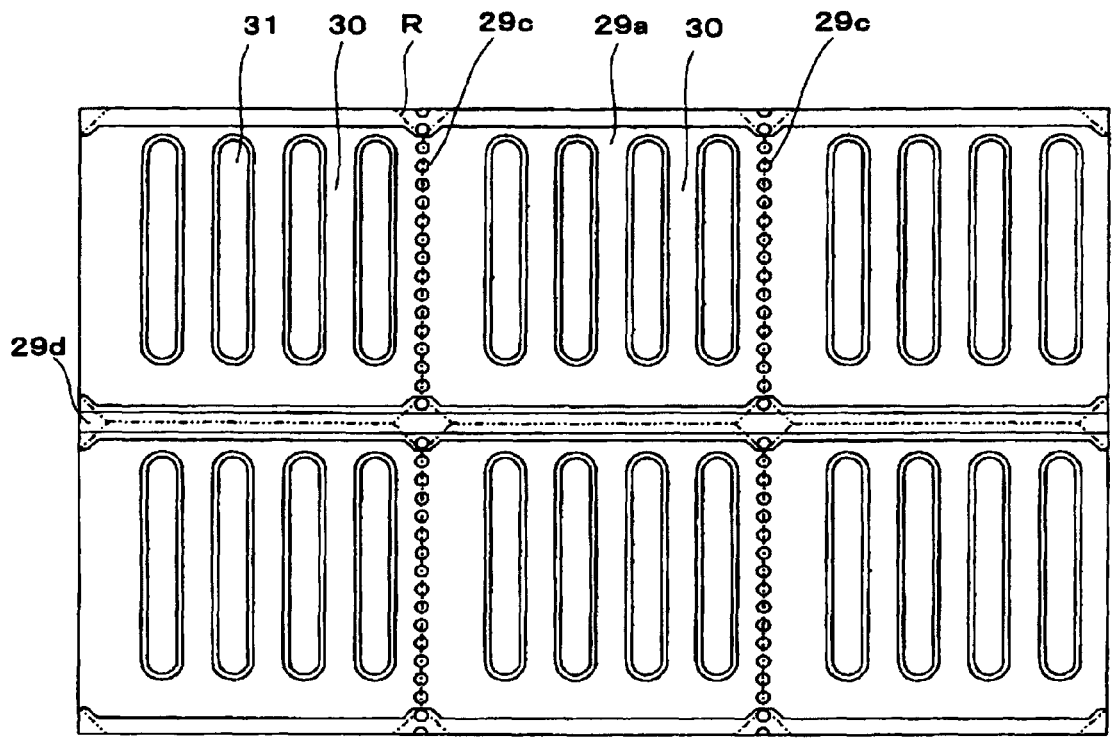
FIG. 9A is a schematic top plan view of a laminate according to the first, fifth and seventh embodiments.
Figure 9B:
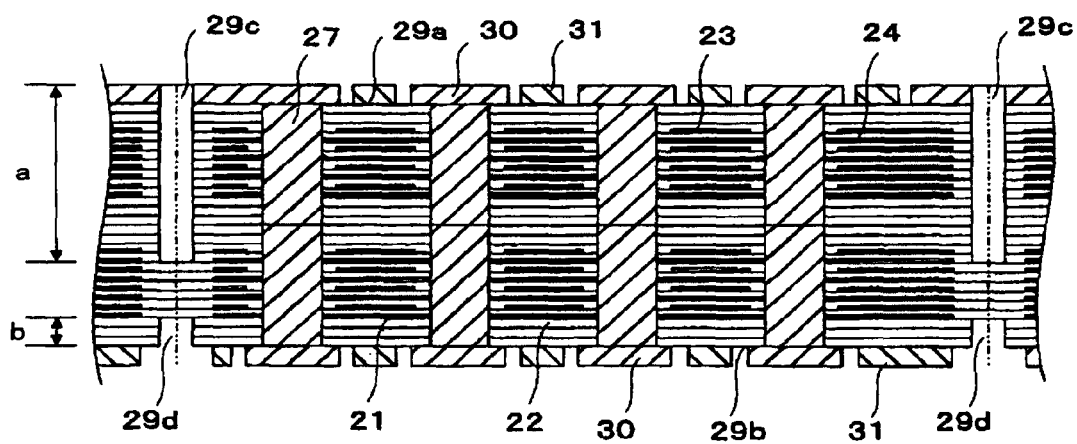
FIG. 9B is a schematic longitudinal section of the laminate according to the first, fifth and seventh embodiments.

After the external electrode patterns 30 and 31 were formed on the principal faces 29a and 29b, perforated break trenches 29c (first break trenches) and continuous line break trenches 29d (second break trenches) extending through the external electrode patterns 30 and 31 are individually formed by a laser beam or the like along the boundaries of the capacitor forming areas R (FIG. 9A and FIG. 9B).

On the side of the principal face 29a, the break trenches 29c are formed in the boundaries along the transverse direction of the principal face 29a in the capacitor forming areas R, and the break trenches 29d are formed in the boundary along the longitudinal direction of the principal face 29a in the capacitor forming areas R.

On the side of the principal face 29b, the break trenches 29c are formed in the boundaries along the longitudinal direction of the principal face 29b in the capacitor forming areas R, and the break trenches 29d are formed in the boundary along the transverse direction of the principal face 29b in the capacitor forming areas R.

As shown in FIG. 9B, the perforated break trenches 29c can be set to have a depth a, which is 20 to 70% of the entire thickness of the product. In this case, the continuous line break trenches 29d can be set to have a depth b, as expressed by a/b=0.25 to 35. Specifically, the depth b can be set at ratios, as shown in Table 1. In this embodiment, the depth a is set to 63% of the entire thickness of the product, and the depth b of the continuous line break trenches 29d are set to 25% of the entire thickness of the product.

TABLE 1

|  | Values Taken by b | | | | | |
| --- | --- | --- | --- | --- | --- | --- |
| at a = 20% | 10% | 20% | 30% | 50% | 70% | 80% |
| a:b | 2 | 1 | 0.67 | 0.4 | 0.29 | 0.25 |
| at a = 70% | 2% | 5% | 10% | 15% | 20% | 30% |
| a:b | 35 | 14 | 7 | 4.67 | 3.5 | 2.3 |

The break trenches 29d are so formed on the sides of the principal faces 29a and 29b as to intersect the break trenches 29c at right angles. Here, the break trench 29c formed on the side of the principal face 29b is formed at positions corresponding to the break trenches 29d formed on the side of the principal face 29a and along the break trenches 29d formed on the side of the principal face 29a. Moreover, the break trenches 29d formed on the side of the principal face 29b are at positions corresponding to the break trenches 29c formed on the side of the principal face 29b and along the break trenches 29c formed on the side of the principal face 29b.

Figure 10A:
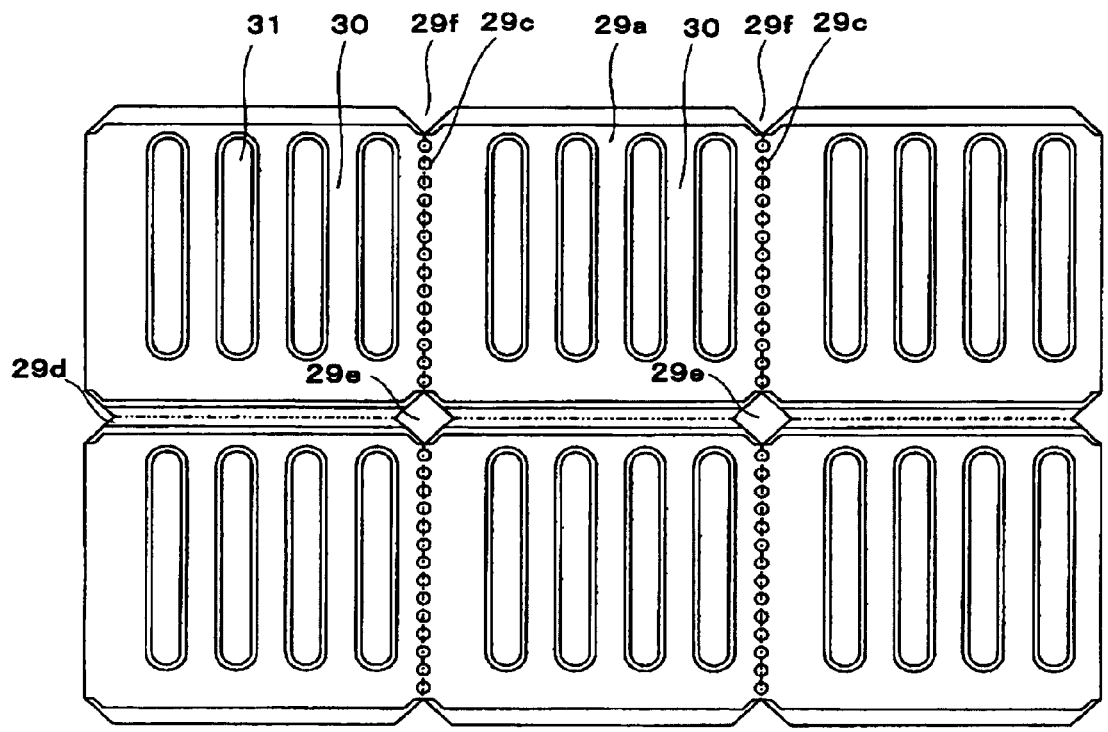
FIG. 10A is a schematic top plan view of a laminate according to the first, fifth and seventh embodiments.

After the break trenches 29c and 29d were formed in the laminate 29, hole portions 29e extending in the thickness direction through the laminate 29 and trenches 29f extending in the thickness direction are formed in the corner portions of the capacitor forming areas R (FIG. 10A). As a result, the portions to become the chamfered portions 21 are formed in the laminate 29.

Figure 10B:
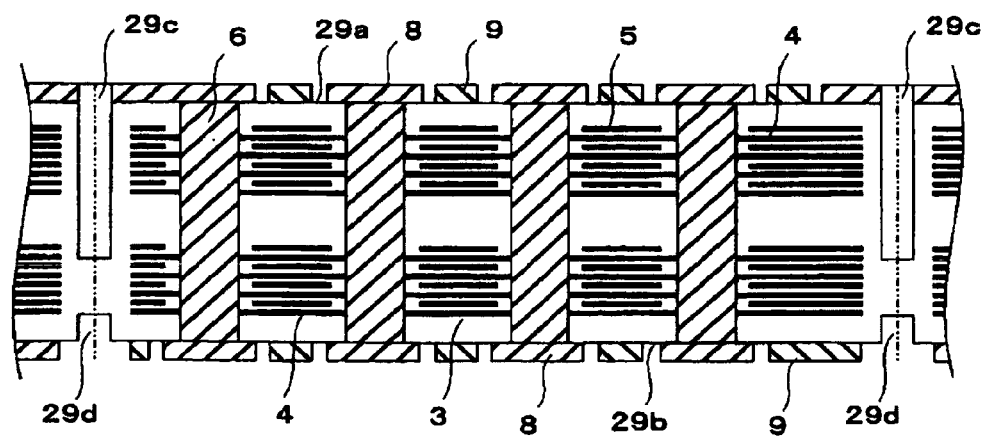
FIG. 10B is a schematic longitudinal section of the laminate according to the first, fifth and seventh embodiments.

After the hole portions 29c and the trenches 29f were formed in the laminate 29, the laminate 29 having the external electrode layers 8 and 9 formed therein is degreased, and is sintered at a predetermined temperature for a predetermined time period. By this sintering, the internal electrode patterns 21 and 23, the ceramic green sheets 22 and 24, the via conductor pastes 27 and 28 and the external electrode patterns 30 and 31 are sintered to form the internal electrode layers 4 and 5, the dielectric layers 3, the via conductors 6 and 7 and the external electrode layers 8 and 9 (FIG. 10B).

After this, the oxide films formed on the surfaces of the external electrode layers 8 and 9 by the sintering is removed by a polishing method such as the jet blasting method. After this, an electric current is fed to the external electrode layers 8 and 9 to form the first and second plated films on the external electrode layers 8 and 9 by the electrolytic plating method. On the side of the principal face 29a, there are formed the break trenches 29c, which are perforated so that the external electrode layers 8 are electrically connected with each other in the longitudinal direction of the principal face 29a. As a result, the electric current flows from the external electrode layers 8 of the capacitor forming areas R, as positioned at one end of the longitudinal direction of the principal face 29a, to the external electrode layers 8 of the capacitor forming areas R, as positioned at the other end, so that the first plated film or the like can be formed as a whole in the longitudinal direction of the principal face 29a on the external electrode layers 8 by the electrolytic plating method. Therefore, the first plated film or the like can be efficiently formed on the external electrode layers 8. A similar description can be made on the side of the principal face 29b. On the side of the principal face 29b, however, the electric current flows from the external electrode layers 8 of the capacitor forming areas R, as positioned on one end of the transverse direction of the principal face 29b, to the external electrode layers 8 of the capacitor forming areas R, as positioned on the other end.

Figure 11:
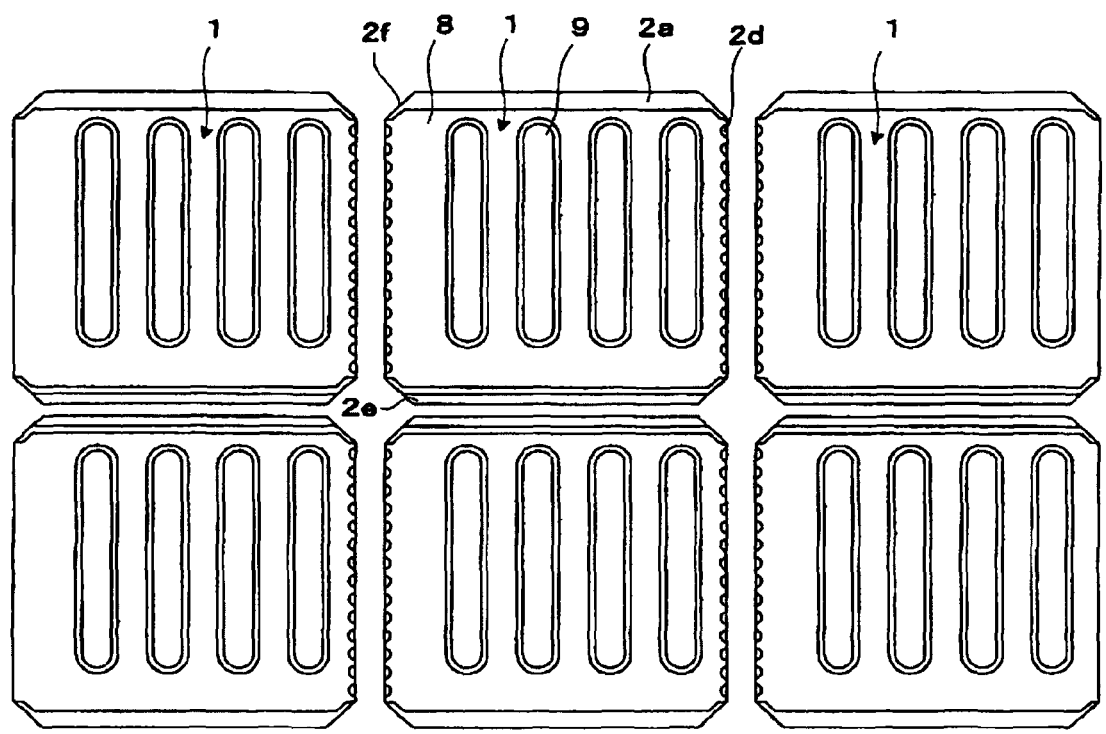
FIG. 11 is a schematic top plan view of a laminate according to the first, fifth and seventh embodiments.

At last, the laminate 29 is divided along the break trenches 29c and 29-d for each of the capacitor forming areas R thereby to manufacture the capacitor 1 or the like shown in FIG. 1 (FIG. 11). In the thickness direction of the laminate 29, the break trenches 29d are formed at positions corresponding to the break trenches 29c. It is, however, desired that the laminate 29 is so divided that the portions near the break trenches 29c is earlier cut away than the portions near the break trenches 29d. This desire is caused by the following reason. Since the external electrode layers 8 and so on exist between the break trenches 29c, the external electrode layers 8 and so on near the break trenches 29c may not be cut along the break trenches 29c if the portions neat the break trenches 29d are earlier cut away than the portions near the break trenches 29c.

Figure 12A:
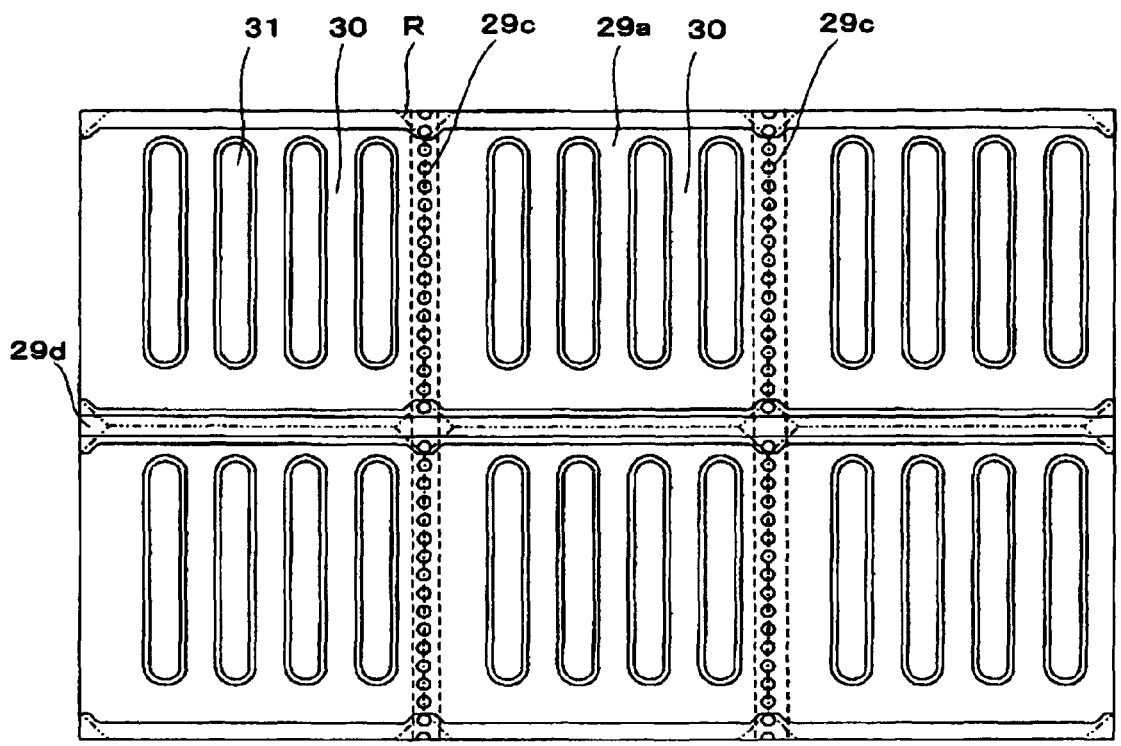
FIG. 12A is a schematic top plan view of a laminate according to a modification of the first, fifth and seventh embodiments.
Figure 12B:
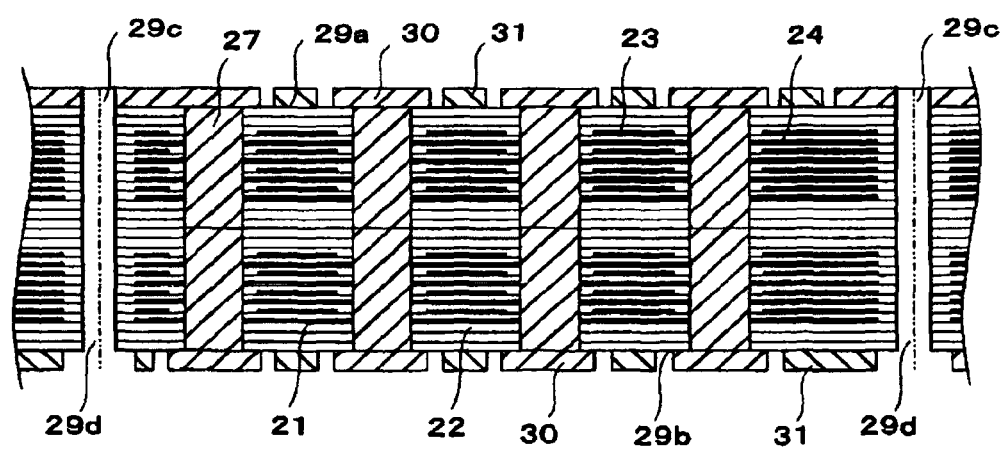
FIG. 12B is a schematic longitudinal section of the laminate according to the modification of the first, fifth and seventh embodiments.

FIGS. 12A, 12B, 13A and 13B are diagrams showing a modification of the aforementioned method for manufacturing the capacitor 1. FIGS. 12A and 12B and FIGS. 13A and 13B show only the step portions different from those of the manufacture method of the modification. Here, FIG. 12A is a schematic top plan view of a laminate according to this modification, and FIG. 12B is a schematic longitudinal section of the laminate.

In this embodiment, as shown in FIGS. 12A and 1213, the perforated break trenches 29c (the first break trenches) and the continuous line break trenches 29d (the second break trenches) are formed, like the above description, at right angles to each other on the side of the principal face 29a, and the break trenches 29d are formed generally in parallel with the break trenches 29c on the back side of the laminate 29. Moreover, the break trenches 29c are formed to extend in the thickness direction of the laminate 29.

Figure 13A:
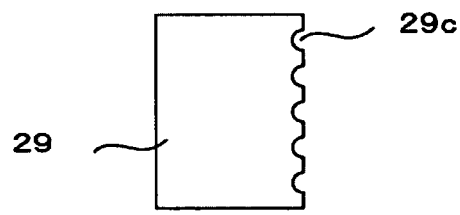
FIG. 13A is a schematic view showing the perforated break trenches, as taken from the surface side, after the laminate was cut into the capacitor in the aforementioned modification.
Figure 13B:
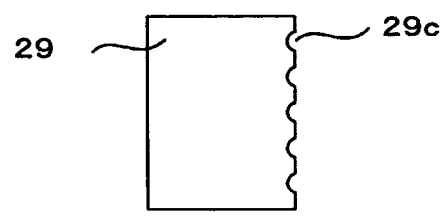
FIG. 13B is a schematic view showing the perforated break trenches, as taken from the back side, after the laminate was cut into the capacitor in the aforementioned modification.

Therefore, the break trenches 29c exhibit, in case the capacitor 1 is cut along the break trenches 29c and 29d, for example, a generally semicircular shape, as shown in FIG. 13A, on the surface side, but such an arcuate shape, is shown in FIG. 13B, on the hack side that the center portions containing the diametrical portions of the generally semicircular shape are chipped because the hole shapes of the break trenches 29c are flattened by the break trenches 29d.

In the manufacture method of this embodiment thus far described, the break trenches 29c extend through the laminate 29, and the break trenches 29d are formed along the break trenches 29c in the back side of the laminate. It is, therefore, possible to divide the laminate 29 more easily for each of the capacitor forming areas R. Moreover, the laminate 29 can be so easily divided that the portions near the break trenches 29c can be separated earlier than the portions near the break trenches 29d. It is, therefore, possible to eliminate such a fear caused by the earlier separation of the portions near the break trenches 29d than the portions near the break trenches 29c that the external electrode layers 8 and so on near the break trenches 29c are not cut along the break trenches 29c.

Figure 14A:
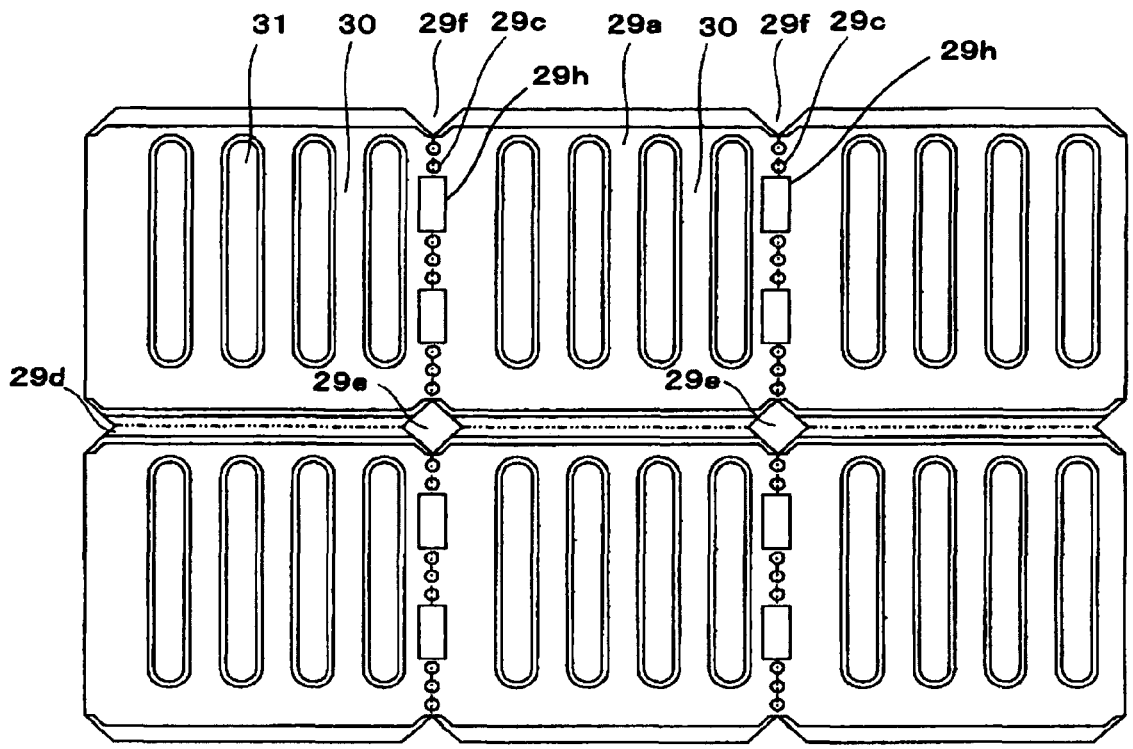
FIG. 14A is a schematic top plan view of a laminate according to another modification of the first, fifth and seventh embodiments.
Figure 14B:
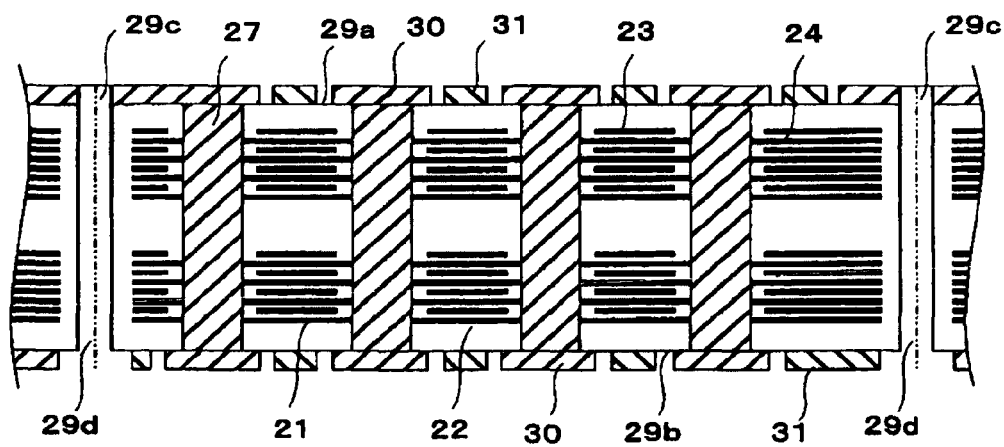
FIG. 14B is a schematic longitudinal section of the laminate according to another modification of the first embodiment.
Figure 15:
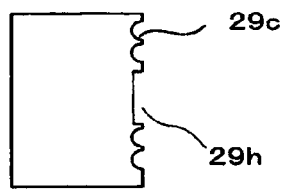
FIG. 15 is a schematic view showing the perforated break trenches, as taken from the surface side, after the laminate was cut into the capacitor in the aforementioned modification.

FIGS. 14A, 14B and 15 are diagrams showing another modification of the aforementioned method for manufacturing the capacitor 1. FIGS. 14A and 14B and FIG. 15 show only the step portions different from those of the manufacture method of the modification. Here, FIG. 14A is a schematic top plan view of a laminate according to this modification, and FIG. 14B is a schematic longitudinal section of the laminate like before.

In this embodiment, as shown in FIGS. 14A and 14B, the perforated break trenches 29c (or the first break trenches) and the continuous line break trenches 29d (or the second break trenches) are formed at right angles to each other on the side of the principal faces 29a, and the break trenches 29d are formed generally in parallel with the break trenches 29c on the back side of the laminate 29. Moreover, the break trenches 29c are formed to extend in the thickness direction of the laminate 29. In this embodiment, moreover, the break trenches 29c do not exist by themselves on the side of the principal face 29a, but are partially replaced by the additional line (or rectangular, specifically) break trenches 29h.

Therefore, in case the capacitor 1 is formed by cutting the laminate shown in FIGS. 14A and 14B along the break trenches 29c, 29d and 29h, the generally semicircular portions caused by the break trenches 29c and the rectangular portions caused by the break trenches 29d coexist on the side of the principal face 29a, as shown in FIG. 15.

In the manufacture method of this embodiment thus far described, the break trenches 29c extend through the laminate 29, and the break trenches 29d are formed along the break trenches 29c in the back side of the laminate. On the side of the principal face 29a, moreover, the break trenches 29c are partially replaced by the line (or rectangular) break trenches 29h like the break trenches 29d. It is, therefore, possible to divide the laminate 29 more easily for each of the capacitor forming areas R. Moreover, the laminate 29 can be so easily divided that the portions near the break trenches 29c can be separated earlier than the portions near the break trenches 29d. It is, therefore, possible to eliminate such a fear caused by the earlier separation of the portions near the break trenches 29d than the portions near the break trenches 29c that the external electrode layers 8 and so on near the break trenches 29c are not cut along the break trenches 29c.

Figure 16:
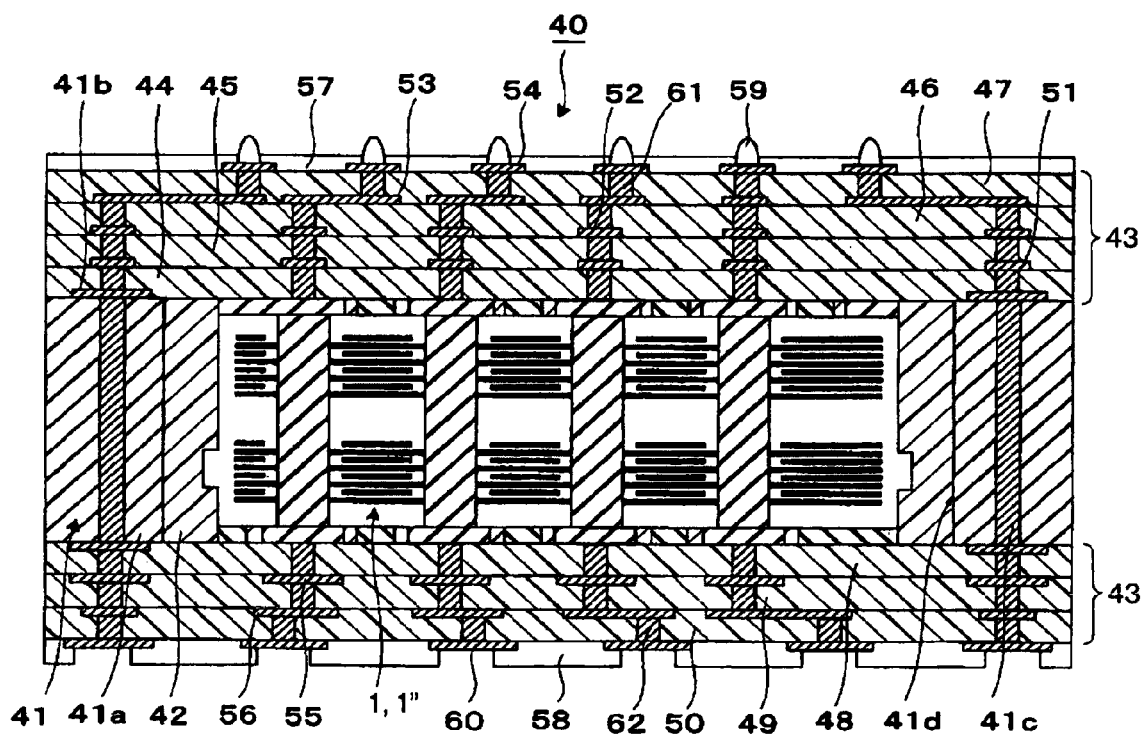
FIG. 16 is a schematic longitudinal section of the wiring substrate; in which the capacitor according to the first, fifth and seventh embodiments is incorporated.

The capacitor 1 is incorporated, when used, in the wiring substrate. The wiring substrate having the incorporated capacitor 1 is described in the following. FIG. 16 is a schematic longitudinal section of the wiring substrate, in which the capacitor according to this embodiment is incorporated.

A wiring substrate 40, as shown in FIG. 16, is an organic substrate formed into a rectangular parallelepiped shape. The wiring substrate 40 is made mainly from a polymeric material, which is reinforced, for example, by using ceramic particles or fibers as a filler.

The wiring substrate 40 is provided with a core substrate 41 as a wiring substrate body forming the core of the wiring substrate 40. The core substrate 41 is constituted to include a core member 41a formed of a glass-epoxy resin composite material, for example, and wiring layers 41b of Cu or the like formed on the two faces of the core member 41a and having a desired pattern.

In the core substrate 41, there are formed a plurality of through holes, which vertically extend through the core substrate 41. In the through holes, there are formed through hole conductors 41c, which are electrically connected with the wiring layers 41h.

In the central portion of the core substrate 41, there is formed an opening 41d, for example, which acts as a capacitor housing portion for accommodating the capacitor 1. The opening 41d is formed into a rectangular parallelepiped shape larger than the capacitor 1, and accommodates the capacitor 1. Here, the capacitor housing portion of the core substrate 41 should not be limited to the opening 41d but may be exemplified by a recess.

At the four corner portions of the inner side face of the core substrate 41, there are formed either the founded portion having a radius of curvature of 0.1 mm or more and 2 mm or less, or a chamfered portion having a chamfer dimension of 0.1 mm or more and 2 mm or less.

The gap between the core substrate 41 and the capacitor 1 is filled with a resin filler 42 made from a polymeric material or the like, for example, as a filler. The capacitor 1 is fixed through that resin filler 42 with respect to the core substrate 41. The resin filler 42 enters the recesses 2d.

The gap between the core substrate 41 and the capacitor 1 is filled with the resin filler 42, for example, such that the position of the capacitor 1 is fixed by the adhesive tape with respect to the core substrate 41 by adhering an adhesive tape to the back of the core substrate 41 and by arranging the capacitor 1 in the opening 41d of the core substrate 41 so as to adhere the back of the capacitor 1 to the adhesive tape. Here, the resin filler 42 has an action to absorb the thermal expansion differences in the in-plane direction and in the thickness direction between the core substrate 41 and the capacitor 1 by its own elastic deformation.

Buildup wiring layers 43 are formed above the core substrate 41 and the principal face 1a of the capacitor 1 and below the core substrate 41 and the principal face 1b of the capacitor 1. The buildup wiring layers 43 are provided with insulating layers 44 to 50 made from a thermoset resin such as an epoxy resin. Between the insulating layers 44 and 45 and so on, there are formed wiring layers 51 to 56, which are made from a conductive material such as Cu.

The upper face of the insulating layer 47 and the lower face of the insulating layer 50 are covered with solder resists 57 and 53 made from a photosensitive resin composite or the like, for example. The solder resists 57 and 58 are provided with openings, from which a terminal 59 to be electrically connected with the semiconductor chip (although not shown) and a terminal 60 to be electrically connected with a main substrate (although not shown), for example, are exposed to the outside. The external electrode layers 8 and 9, the wiring layer 41b and so on are electrically connected with the terminal 59 through the via conductor 61 and so on, and the external electrode layers 8 and 9, the wiring layer 41b and so on are electrically connected with the terminal 60 through via the via conductor 62.

In this embodiment, the recesses 2d extending in the thickness direction of the capacitor body 2 are formed in the side face 2c1 and so on so that they can also be filled with the resin filler 42 thereby to enlarge the contact area between the capacitor 1 and the resin filler 42. Therefore, it is possible to improve the adhesion properties between the resin filler 42 and the capacitor 1 and further to improve the adhesion properties between the resin filler 42 and the core substrate 41. As a result, it is possible to ensure the fixture between the core substrate 41 and the capacitor 1 thereby to provide a highly reliable wiring substrate 40. Here, effects like the aforementioned ones can also be attained, even in case projections extending in the thickness direction of the capacitor body 2 are formed on the side face 2c1 and so on in place of or together with the recesses 2d.

Moreover, the recesses 2d can increase the filling quantity of the resin filler 42 the more as their number is the more within such a range as to deteriorate the strength of the capacitor 1. As a result, the fixture between the core substrate 41 and the capacitor 1 can be made more reliable to provide the highly reliable wiring substrate 40.

In this embodiment, the recesses 2d are formed in the side faces 2c1 and 2c2 on the side of the first principal face 2a, and the recesses 2d are formed in the side face 2c3 on the side of the second principal face 2b so that the vertical movements of the capacitor 1 with respect to the core substrate 41 can be suppressed. In the state where the capacitor 1 is incorporated in the wiring substrate 40, specifically, the recesses 2d are formed in the side faces 2c1 and 2c2 on the side of the first principal fate 2a, and the resin filler 42 has filled the recesses 2d. Even in case, therefore, a force is applied from the second principal face 2b to the first principal face 2a, it is hard to move the capacitor 1 upward. Moreover, the recesses 2d are formed in the side face 2c3 on the side of the second principal face 2b, and the resin filler 42 has filled the recesses 2d. Even in case, therefore, a force is applied from the first principal face 2a to the second principal face 2b, it is hard to move the capacitor 1 downward. Therefore, it is possible to suppress the vertical movements of the capacitor 1 with respect to the core substrate 41.

Since the side face 2c1 and so on are made exclusively of the dielectric layers 3 as in this embodiment, the external electrode layers 8 on the side of the first principal face 2a and the external electrode layers 9 on the side of the second principal face 2b are hard to short electrically, even in case the shavings, as are discharged when the break trenches 29c and 29d are to be formed, of the external electrode patterns 30 and 31 stick to the side face 2c1 and so on.

If the capacitor having a warpage of 100 μm or more is to be incorporated in the wiring substrate 40, it is difficult to incorporate the capacitor in the wiring substrate 40, and it is liable that cracks are formed in the dielectric layers constituting the capacitor. In this embodiment, on the contrary, the capacitor 1 has a warpage of less than 100 μm, it is easy to incorporate the capacitor 1 in the wiring substrate 40, and the cracks are hard to form in the dielectric layers 3 when the capacitor 1 is to be incorporated in the wiring substrate 40.

In this embodiment, the chamfered portions 2f having the chamfer dimension C1 of 0.6 mm or more are formed at the corner portions of the outer periphery 2c of the capacitor body 2. As a result, the thermal stress is not concentrated at the corner portions of the resin filler 42 on the side of the capacitor 1 so that the cracks can be prevented from occurring at the corner portions of the resin filler 42 on the side of the capacitor 1. Here, effects like those of the chamfered portions 2f can also be attained, even in case rounded portions having a radius of curvature of 0.6 mm or more are formed at the corner portions of the outer periphery 2c of the capacitor body 2.

In this embodiment, the chamfered portions 2f and the rounded portions are formed at the corner portions of the outer periphery 2c of the capacitor body 2. In case, therefore, neither the chamfered portions 2f nor the rounded portions are formed, the distances from the signal lines existing near the corner portions of the capacitor to the dielectric layers 3 are enlarged. Therefore, it is possible to reduce the signal delays of the signal lines existing near the corner portions of the capacitor 1.

There exists the so-called "castellation" for forming recesses in the end portions of the wiring substrate thereby to form the terminal electrodes in those recesses. In the castellation, not the resin material but the terminal electrodes are formed in the recesses. In the mode of using the specific constitution and recesses, therefore, the invention is different from the castellation.

Second Embodiment

Figure 17A:
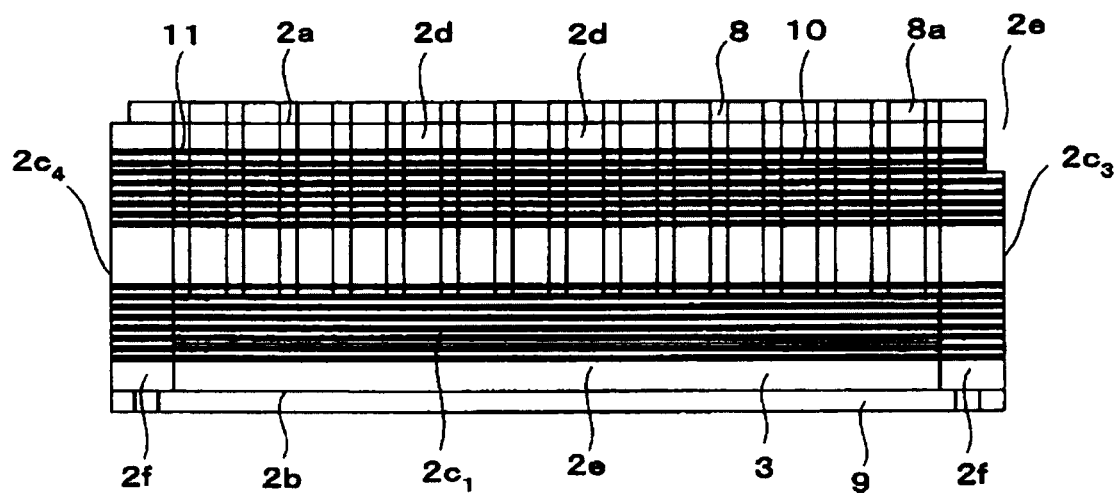
FIG. 17A and FIG. 17B are schematic side elevations of a capacitor to be incorporated in the wiring substrate according to a second embodiment.
Figure 17B:
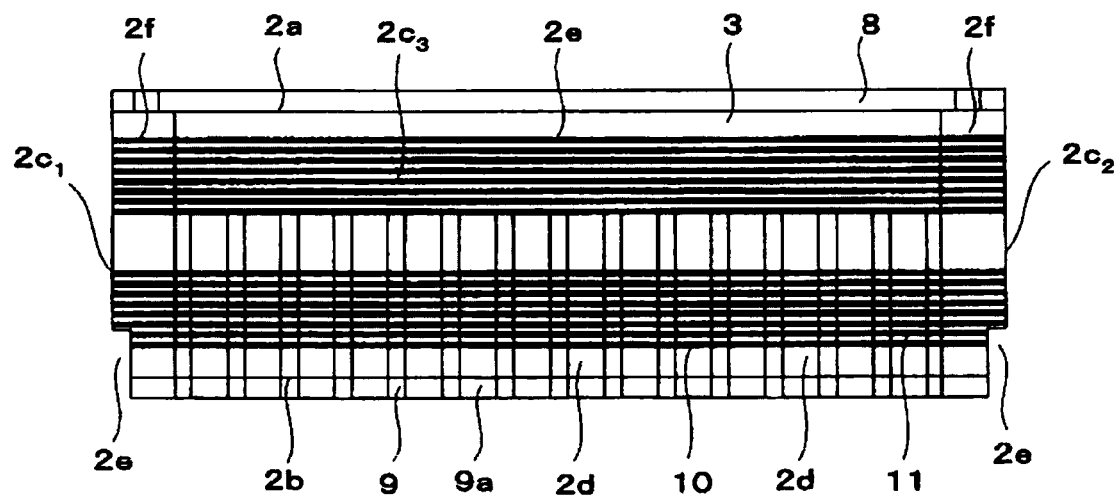
Figure 18:
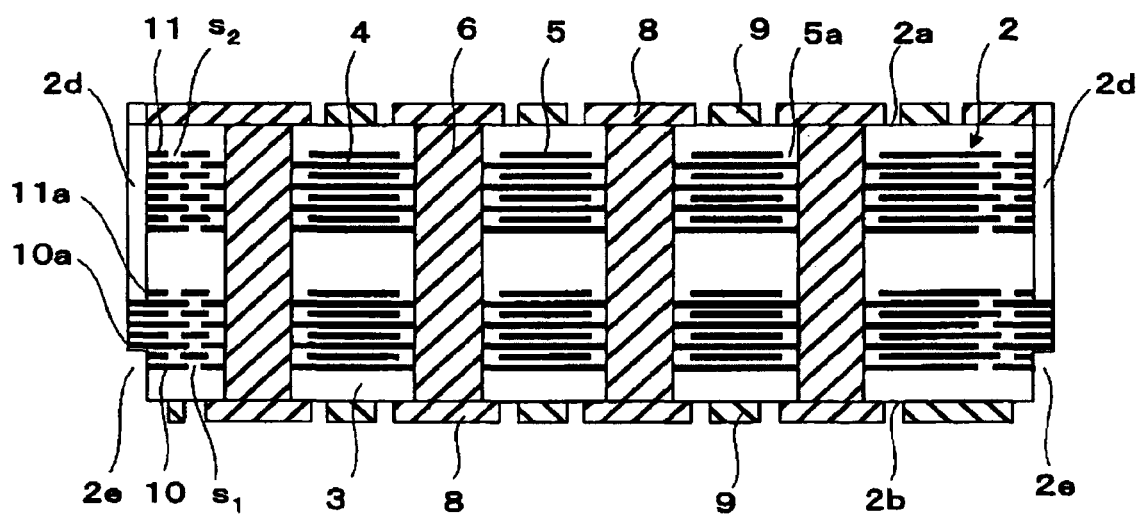
FIG. 18 is a schematic longitudinal section of the capacitor to be incorporated in the wiring substrate in accordance with the second embodiment.

A second embodiment of the invention is described with reference to the accompanying drawings. This embodiment is described on the example, in which the capacitor body is provided with dummy electrodes closer to the side of the outer periphery of the dielectric layer than the internal electrode layers. Here in the second to eighth embodiments, the same portions as those having been described in the first embodiment are designated by the common reference numerals, and the contents overlapping those having been described in the first embodiment may be omitted. FIG. 17A and FIG. 17B are schematic side elevations of a capacitor to be incorporated in the wiring substrate according to this embodiment. FIG. 18 is a schematic longitudinal section of the capacitor to be incorporated in the wiring substrate.

In the capacitor body 2, as shown in FIGS. 17A and 17B and FIG. 18, there are arranged dummy electrode layers 10 and 11, which do not function as electrodes. Specifically, the dummy electrode layers 10 and 11 are arranged between the dielectric layers 3 at predetermined gaps from the internal electrode layers 4 and 5 on the side closer to the outer periphery (i.e., to the outer periphery 2c) of the dielectric layers 3 than the internal electrode layers 4 and 5.

The dummy electrode layers 10 (the first dummy electrode layers) are arranged in substantially the same plane as that of the internal electrode layers 4, and the dummy electrode layers 11 (the second dummy electrode layers) are arranged, in substantially the same plane as that of the internal electrode layers 5. Specifically, the dummy electrode layers 10 are arranged between the same layers as those between the dielectric layers 3, in which the internal electrode layers 4 are arranged, and the dummy electrode layers 11 are arranged between the same layers as those between the dielectric layers 3, in which the internal electrode layers 5 are arranged. Here, the dummy electrode layers 10 and 11 may also be formed between the layers different from those between the dielectric layers 3, in which the internal electrode layers 4 and 5 are arranged.

The internal electrode layers 4 and the dummy electrode layers 10, and the internal electrode layers 5 and the dummy electrode layers 11 are electrically insulated from each other. Here, the dielectric layers 3 individually enter gaps s1 and s2 between the internal electrode layers 4 and 5 and the dummy electrode layers 10 and 11 thereby to insulate the internal electrode layers 4 and 5 and the dummy electrode layers 10 and 11 reliably electrically.

The gaps s1 between the internal electrode layers 4 and the dummy electrode layers 10 and the gaps s2 between the internal electrode layers 5 and the dummy electrode layers 11 have so positional relations as are deviated in the thickness direction of the capacitor body 2 that they do not overlap. Here, the gaps s1 between the internal electrode layers 4 and the dummy electrode layers 10 are arranged with each other in the thickness direction of the capacitor body 2, and the gaps s2 between the internal electrode layers 5 and the dummy electrode layers 11 are arranged with each other in the thickness direction of the capacitor body 2.

The dummy electrode layers 10 and 11 are formed to enclose the internal electrode layers 4 and 5. Moreover, the outer peripheries 10a and 11a of the dummy electrode layers 10 and 11 are exposed from between the dielectric layers 3 to the outside. Therefore, the side faces 2c1, 2c2, 2c3 and 2c4 are constituted of the dielectric layers 3 and the dummy electrode layers 10 and 11. Here, the side faces of the recesses 2d and the notches 2e in the side faces 2c1, 2c2 and 2c3 are also constituted of the dielectric layers 3 and the dummy electrode layers 10 and 11.

Considering the reduction of the steps to be formed near the end portions of the capacitor 1, it is preferred that the outer peripheries of the dummy electrode layers 10 and 11 are wholly exposed from between the dielectric layers 3 to the outside, but it is arbitrary that the outer peripheries 10a and 11a are only partially exposed to the outside.

Considering the reduction of the steps to be formed near the end portions of the capacitor 1, it is preferred that the total number of the dummy electrode layers 10 and 11 is one half (about fifty layers) or more of that of the internal electrode layers 4 and 5, and it is more preferred that the total number is substantially equal (about 100 layers) to that of the internal electrode layers 4 and 5.

The dummy electrode layers 10 and 11 are made from a conductive material. Considering the influences at the sintering steps and the forming steps of the ceramic green sheets 22 and 24, however, it is preferred that the conductive material to make the dummy electrode layers 10 and 11 are the seine conductive material as that to make the internal electrode layers 4 and 5. For similar reasons, moreover, it is preferred that the thickness of the dummy electrode layers 10 and 11 is substantially equal to that (e.g., 2 μm or less) of the internal electrode layers 4 and 5.

In this embodiment, too, the recesses 2d extending in the thickness direction of the capacitor body 2 are formed in the side face 2c1 and so on, so that effects substantially similar to those of the first embodiment can be attained, in this embodiment, like the first embodiment, the projections extending in the thickness direction of the capacitor body 2 may be formed in the side face 2c1 and so on in place of or together with the recesses 2d. In this case, too, effects similar to the aforementioned ones can be attained.

In this embodiment, the dummy electrode layers 10 and 11 are, formed on the side closer to the outer periphery of the dielectric layers 3 than the internal electrode layers 4 and 5. Therefore, the end portions of the capacitor body 2 can be made thick to provide the capacitor 1, in which the steps to be formed near the end portions thereof can be reduced. When the gaps between the core substrate 41 and the capacitor 1 are filled with the resin filler 42, therefore, this resin filler 42 is hard to dive to the back side (the side of the second principal face 2b) of the capacitor 1. As a result, it is possible to reduce the faults at the subsequent buildup step.

In case the gap s1 between the internal electrode layers 4 and the dummy electrode layers 10 and the gap s2 between the internal electrode layers 5 and the dummy electrode layers 11 overlap in the thickness direction of the capacitor body 2, there exist the portions, in which both the internal electrode layers 4 and 5 and the dummy electrode layers 10 and 11 are absent in the thickness direction of the capacitor body 2. These portions have neither the internal electrode layers 4 and 5 and the dummy electrode layers 10 and 11 so that they become thinner than the remaining portions and are locally recessed. In case these recesses are formed at portions relatively near the outer periphery of the capacitor 1, the resin filler 42 may dive to the back side of the capacitor 1. In this embodiment, on the contrary, the gap s1 between the internal electrode layers 4 and the dummy electrode layers 10 and the gap s2 between the internal electrode layers 5 and the dummy electrode layers 11 do not overlap in the laminating direction of the dielectric layers 3. Therefore, such local recesses is hardly farmed to suppress the dive of the resin filler 42.

In this second embodiment, the dummy electrode layers 10 and 11 may also be replaced by at least either the internal electrode layers 4 or 5, which extend to the hide faces 2c1, 2c2, 2c3 and 2c4 of the capacitor body 2. In case the internal electrode layers 4 and 5 are exposed to the side faces 2c1, 2c2, 2c3 and 2c4 and in case the shavings of the eternal electrode patterns 30 and 31 stick to the side faces 2c1, 2c2, 2c3 and 2c4, the end portions of the capacitor body 2 can be easily made thick, although shorts may occur. As a result, the steps to be formed near the end portions of the capacitor 1 can be reduced. In case the shavings stick to the side faces 2c1, 2c2, 2c3 and 2c4, it is also possible to add the step of removing the shavings and so on.

Third Embodiment

Figure 19A:
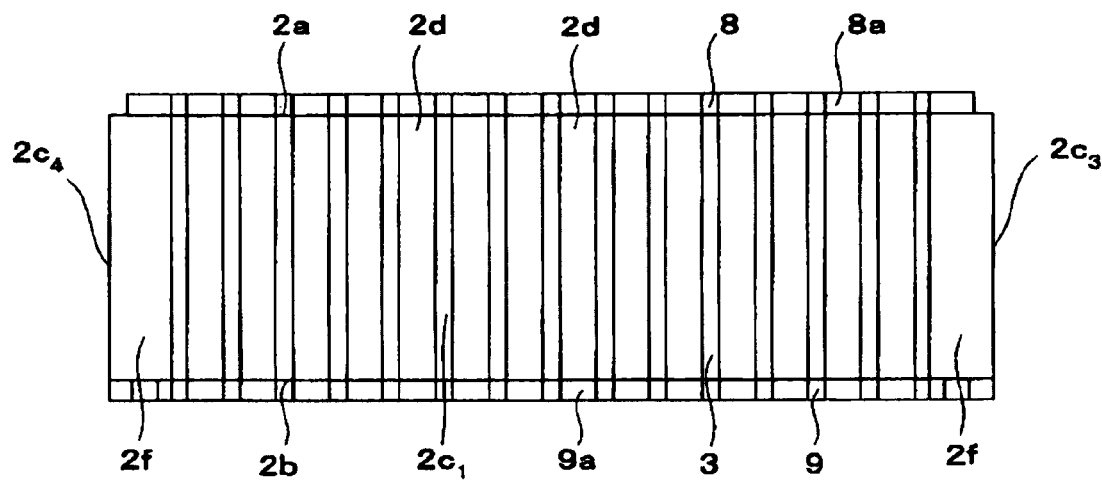
FIG. 19A and FIG. 19B are schematic side elevations of the capacitor to be incorporated in the wiring substrate in accordance with a third embodiment.
Figure 19B:
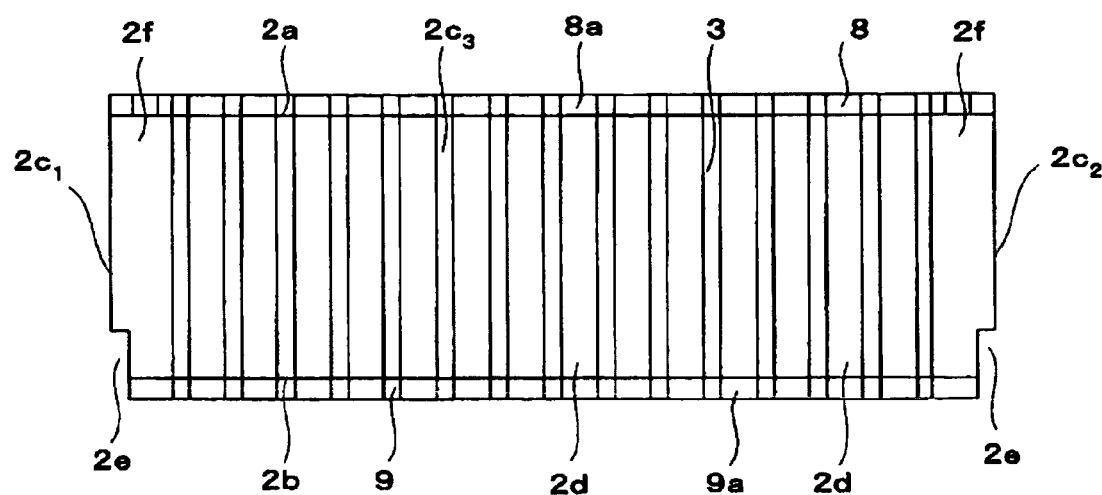

A third embodiment of the invention is described in the following with reference to the drawings. This embodiment is described on the example, in which recesses extending from one principal face to the other principal face are formed in the side faces of the capacitor body. FIG. 19A and FIG. 19B are schematic side elevations of the capacitor to be incorporated in the wiring substrate in accordance with this embodiment.

As shown in FIG. 19A and FIG. 19B, the recesses 2*d* provided in the side faces 2*c*1, 2*c*2 and 2*c*3 are formed from the first principal face 2*a* to the second principal face 2*b* of the capacitor body 2. In the side faces 2*c*1, 2*c*2 and 2*c*3, moreover, projections extending from the first principal face 2*a* to the second principal face 2*b* of the capacitor body 2 may also be formed in place of or together with the recesses 2*d*. In this embodiment, the notches 2*e* are not formed. In this embodiment, moreover; the dummy electrode layers 10 and 11 are not arranged, but may also be arranged.

In this embodiment, too, the recesses 2*d* extending from the first principal face 2*a* to the second principal face 2*b* of the capacitor body 2 are formed in the side face 2*c*1 and so on, so that similar effects as those of the first embodiment can be attained. Here, effects similar to the aforementioned ones can also be attained, in case the projections extending from the first principal face 2*a* to the second principal face 2*b* of the capacitor body 2 are formed in the side face 2*c*1 and so on in place of or together with the recesses 2*d*.

Fourth Embodiment

Figure 20:
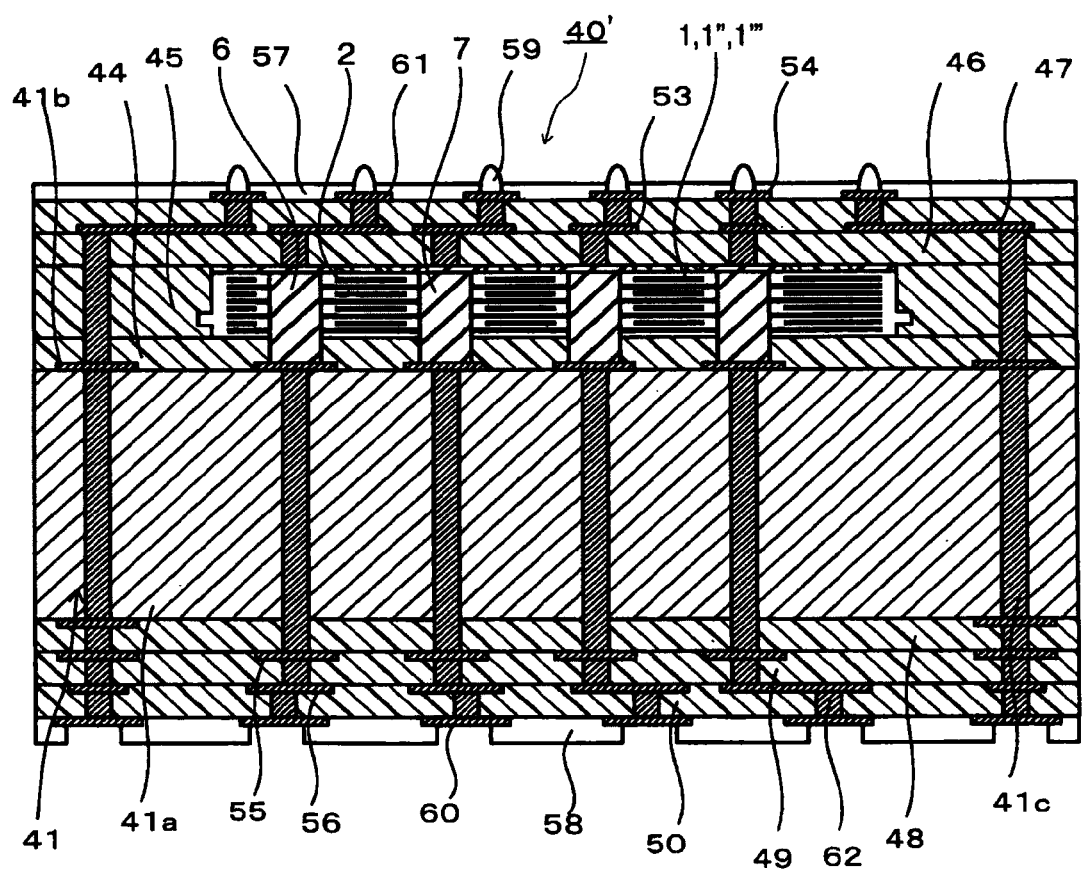
FIG. 20 is a schematic longitudinal section of the wiring substrate, in which a capacitor to be incorporated in the wiring substrate in accordance with fourth, sixth and eighth embodiments is incorporated.

A fourth embodiment of the invention is described in the following with reference to the drawing. This embodiment is described on the example, in which the capacitor is arranged between the insulating layers on the core substrate. FIG. 20 is a schematic longitudinal section of the wiring substrate 40', in which a capacitor to be incorporated in the wiring substrate in accordance with this embodiment is incorporated.

As shown in FIG. 20, no opening is formed in the core substrate 41, but the capacitor 1' is arranged between the insulating layers 44 and 45 above the core substrate 41. The capacitor 1' of this embodiment has a total number of ten of the internal electrode layers 4 and 5, and is thinner than the capacitor 1, which has been described in connection with the first embodiment.

The capacitor 1' can be arranged between the insulating layers 44 and 45, for example, by the following procedure. At first, the capacitor body 2 having the plated films formed on the external electrode layers 8 and 9 is arranged over the insulating layer 44 formed on the core substrate 41. After this, the insulating layer 45 is placed on the capacitor body 2, and these components are pressurized while being heated. As a result, the insulating layer 45 on the capacitor body 2 flows sideway of the capacitor body 2 so that the capacitor body 2 is arranged between the insulating layers 44 and 45. After this, via holes are formed through the insulating layers 44 and 45, and the via conductors 6 and 7 connected with the wiring layer 41*b* are formed in the via holes thereby to complete the capacitor 1'.

In this embodiment, the capacitor 1' is arranged between the insulating layers 44 and 45 formed on the core substrate 41 so that the distance between the capacitor 1' and the semiconductor chip can be made shorter. Therefore, it is possible to reduce the wiring resistance and the inductance.

Fifth Embodiment

Figure 21A:
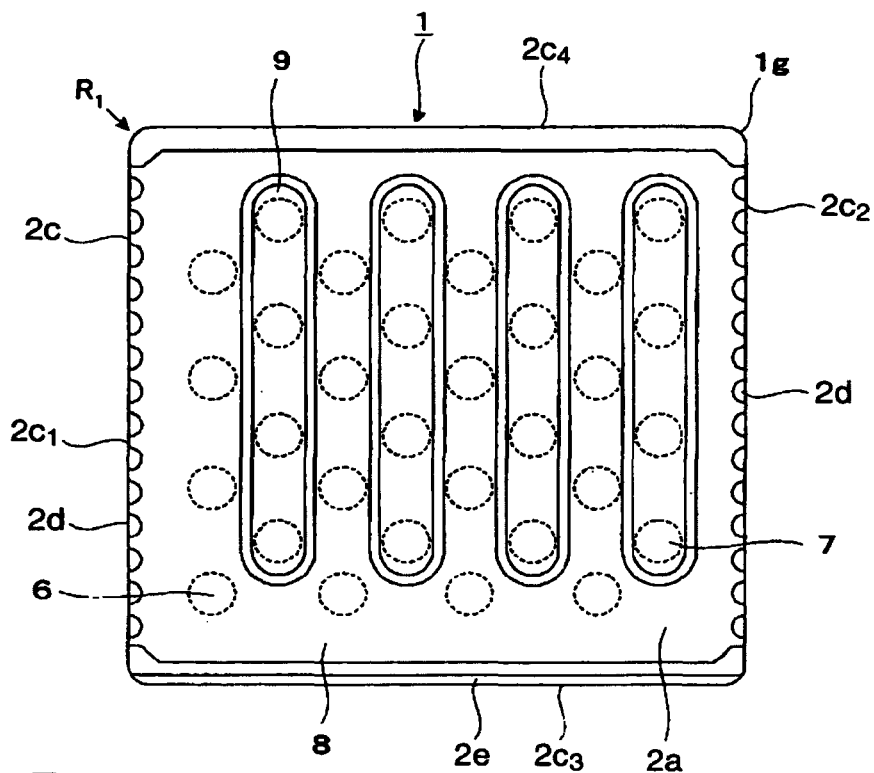
FIG. 21A and FIG. 21B are schematic top plan views of another capacitor to be incorporated in the wiring substrate in accordance with the fifth embodiment.
Figure 21B:
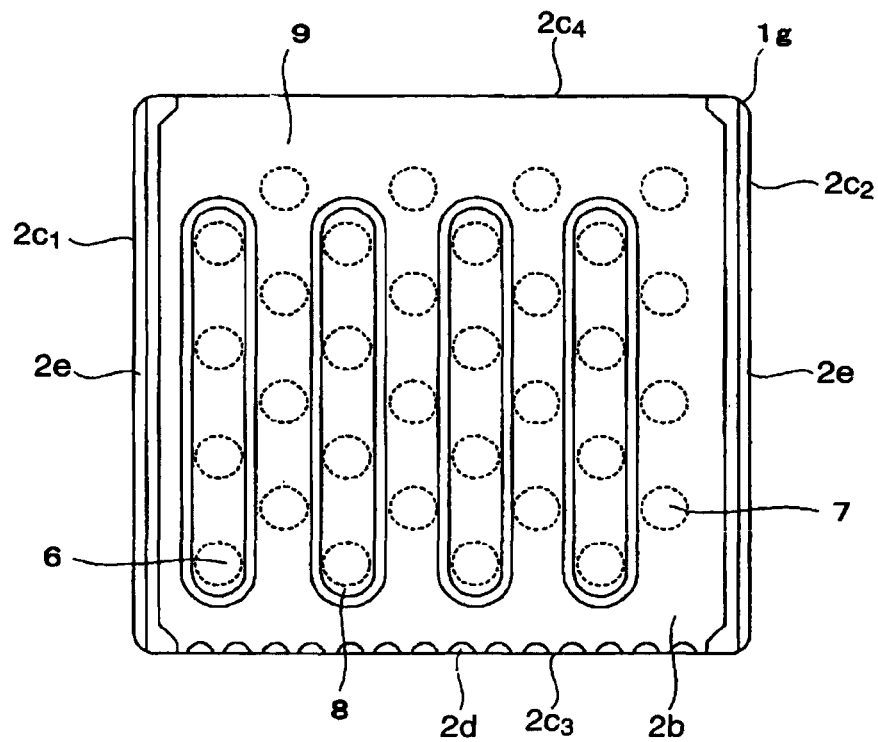

A fifth embodiment of the invention is described in the following with reference to the accompanying drawings. FIG. 1A and FIG. 1B are schematic top plan views of a capacitor to be incorporated in a wiring, substrate in accordance with the embodiment; FIG. 3A is a schematic longitudinal section of the capacitor and taken along line A-A of FIG. 1A; and FIG. 3B is a schematic longitudinal section of the capacitor and taken along line B-B of FIG. 1A. FIG. 21A and FIG. 21B are schematic top plan views of another capacitor to be incorporated in the wiring substrate in accordance with this embodiment.

The capacitor 1 to be incorporated in the wiring substrate (as will be shortly called the "capacitor"), as shown in FIGS. 1A, 1B, 3A and 3B, is a laminated capacitor formed into a rectangular parallelepiped shape and having a warpage less than 100 µm. The capacitor 1 is preferred to have longitudinal and transverse dimensions of 5.0 mm or more. The capacitor 1 is formed to have those dimensions so that it can have similar size as that of the semiconductor chip. Therefore, it is possible to effectively reduce the thermal expansion difference between the semiconductor chip and the wiring substrate 40.

In the side faces 2*c*1, 2*c*2 and 2*c*3 of the capacitor body 2, there are individually formed the semicylindrical trenches 2*d* extending in the thickness direction of the capacitor body 2 and the trenches 2*e* extending in the circumferential direction. In this embodiment, the trenches 2*d* and 2*e* are formed by dividing the laminate 29 along the later-described break trenches 29*c* and 29*e*. In this embodiment, the trenches 2*d* and 2*e* are not formed but may also be formed in the side face 2*c*4.

The chamfered portion 2*f* may be formed in at least one corner portion of the outer periphery 2*c* of the capacitor 1. Considering the suppression of the cracks of the later-described resin filler 42 or the like, however, it is preferred that the chamfered portions 2*f* are formed in all the corner portions.

Of the four chamfered portions 2*f*, only one chamfered portion 2*f* having a different chamfer dimension C1 may be formed in the capacitor 1. Moreover, only one chamfered portion 2*f* need not be changed in the chamfer dimension C1 but may also be changed in the shape.

It is desired from the viewpoint of the manufacturing of the capacitor that the chamfer dimension C1 is 0.8 mm or more and 1.2 mm or less. As shown in FIG. 21A and FIG. 21B, moreover, a rounded portion 1*g* having a radius of curvature R1 of 0.6 mm or more may be formed, in place of or together with the chamfered portions 2*f*, in at least one corner portion of the outer periphery 2*c* of the capacitor 1, in this case, it is desired from the viewpoint of the capacitor manufacture that the radius of curvature R1 of the rounded portion 1*g* is 0.8 mm or more and 1.2 mm or less. As in the chamfered portions 2*f*, moreover, only one of the rounded portions 1*g* may also be provided with a rounded portion 1*g* having a radius of curvature R1 different from that of the remaining rounded portions 1*g*.

The chipping quantity of the dielectric layers 3 of one chamfered portion 2*f* or the rounded portion 1*g* is desired to be 0.5 mm or less for the length, width and depth.

Figure 22A:
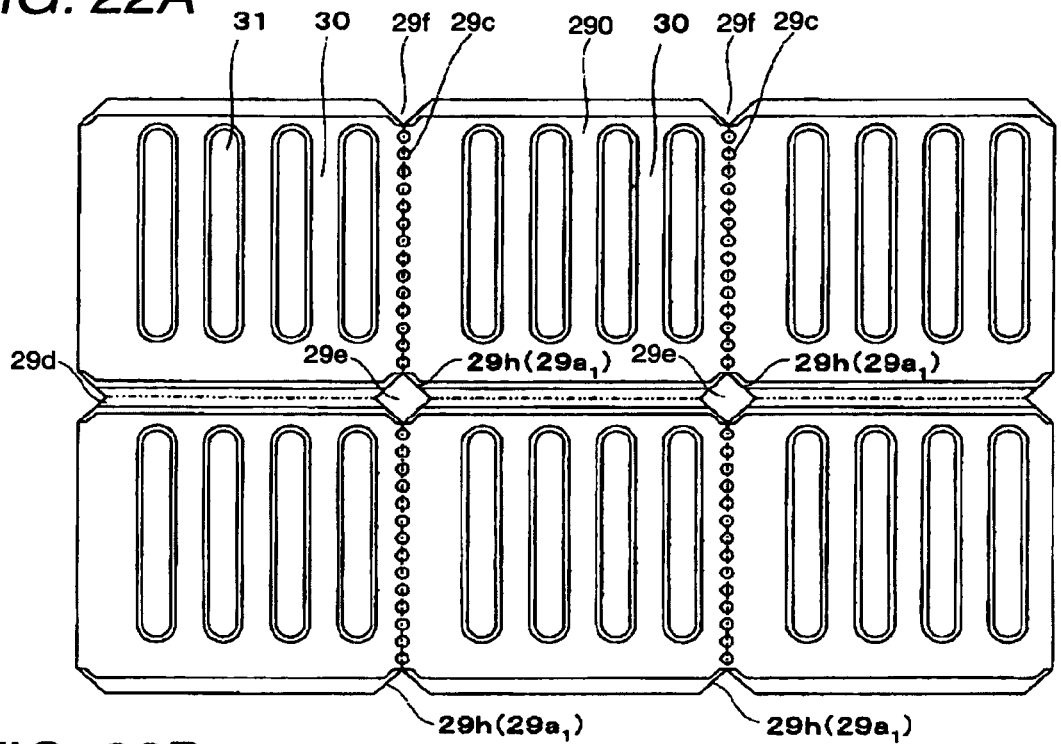
FIG. 22A is a schematic top plan view of a laminate according to the fifth embodiment.
Figure 22B:
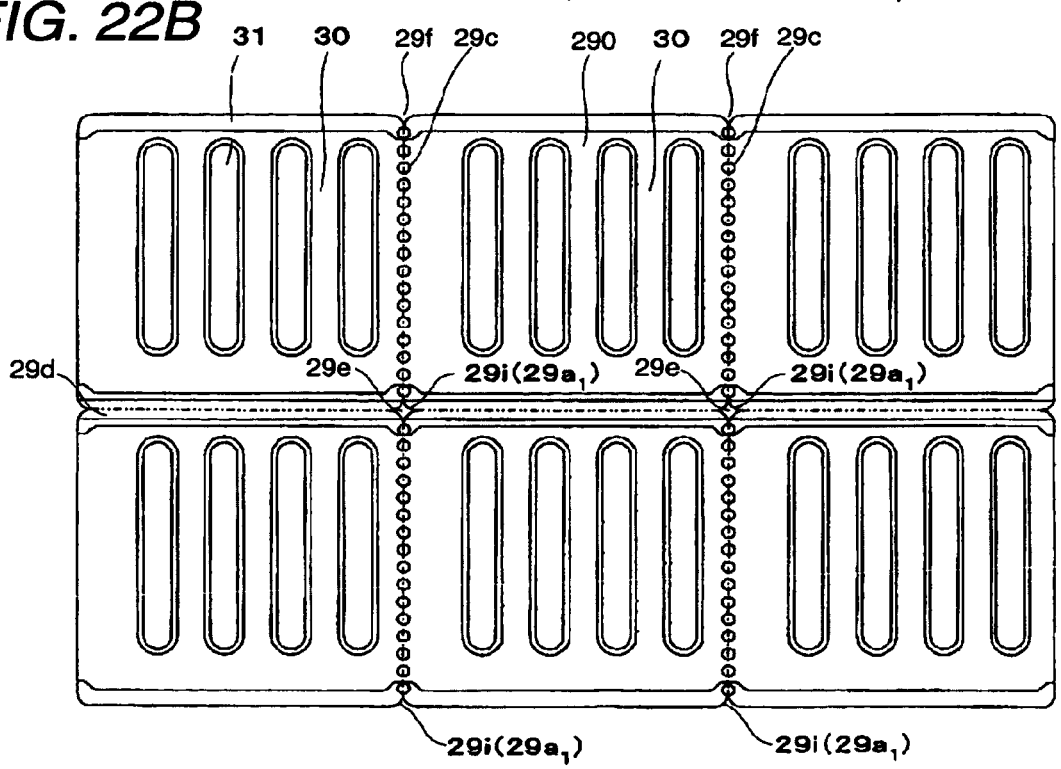
FIG. 22B is a schematic top plan view of another laminate according to the fifth embodiment.

In the procedure of manufacturing the capacitor 1, as described in connection with the first embodiment, after the break trenches 29*c* and 29*d* were formed in the laminate 29, the hole portions 29*e* extending in the thickness direction of the laminate 29 and trenches 29*f* extending in the thickness direction are formed (FIG. 22A) in the outer periphery of a portion 290 to become the capacitor 1, that is, in portions 29*a*1 (the corner portion of the capacitor forming areas R) to become the corner portions of the outer periphery 2*c* of the capacitor 1 in the portion 290 to become the capacitor 1. The trenches 29*f* are formed on the outer periphery of the laminate 29. Chamfered portions 29*h* (the notched holes) to become the chamfered portions 2*f* of the capacitor 1 are formed in the laminate 29 by forming the hole portions 29*e* and the trenches 29*f*. Rounded portions 29*i* (notched holes) to become the rounded portions 1*g* of the capacitor 1 can also be formed (FIG. 22B) in place of or together with the chamfered portions 29h by a similar method in the laminate 29. The chamfered portions 29h and the rounded portions 29i are the portions to become the chamfered portions 2f and the rounded portions 1g after the laminate 29 was divided. Here, the chamfer dimension of the chamfered portions 29h is similar to the chamfer dimension C1 of the chamfered portions 2f, and the radius of curvature of the rounded portions 29i is similar to the radius of curvature R1 of the rounded portions 1g.

Figure 23:
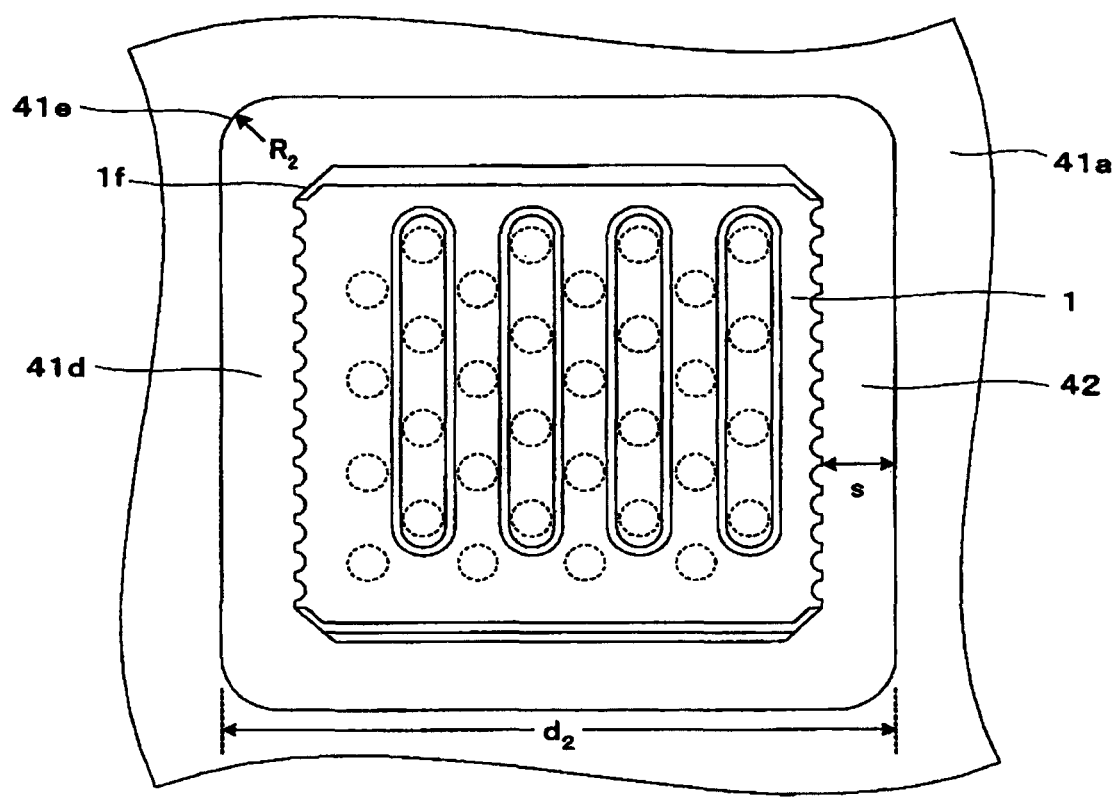
FIG. 23 is a schematic transverse section of the wiring substrate, in which the capacitor according to the fifth embodiment is incorporated.

The capacitor 1 is incorporated, when used, in the wiring substrate. The wiring substrate having the incorporated capacitor 1 is described in the following. FIG. 16 is a schematic longitudinal section of the wiring substrate, in which the capacitor according to this embodiment is incorporated, and FIG. 23 is a schematic transverse section of the wiring substrate, in which the capacitor according to this embodiment is incorporated. The description, which has been made on the first embodiment in FIG. 16, is applied to this embodiment.

It is preferred that the core substrate 41 has an opening diameter d2 of 13.0 mm or more and 15.0 mm or less. The opening diameter d2 is the length of one side of the opening 41d and is specified, by the length shown in FIG. 23. The reason why the opening diameter d2 of the core substrate 41 is 13.0 mm or more is that the opening 41d has to be larger than the size of the capacitor 1 so as to accommodate the capacitor 1. In case either of the longitudinal or transverse dimension is 13.0 mm, it is natural that the opening diameter d2 of the core substrate 41 is larger than 13.0 mm. The reason why the opening diameter d2 of the core substrate 41 is 15.0 mm or less is that the routing of the wiring in the wiring substrate 40 is difficult if the opening 41d is excessively large.

The gap s, as shown in FIG. 23, between the core substrate 41 and the capacitor 1 is preferred to be 0.5 mm or more and 2.0 mm or less, because it is difficult to fill the later-described resin filler 42, if the gap is excessively narrow, and because the wiring space of the core substrate 41 is short, if the cap is excessively wide.

As shown in FIG. 23, moreover, rounded portions 41c having a radius of curvature R2 of 0.1 mm or more and 2 mm or less are formed in the four corner portions of the inner side face of the core substrate 41. Here, the rounded portions 41e need not be formed, but may be formed, if formed, in at least one portion of the inner side face of the core substrate 41. Chamfered portions having a chamfer dimension of 0.1 mm or more and 2 mm or less may be formed in the corner portions of the inner side face in place of or together with the rounded portions 41e.

In this embodiment, the chamfered portions 29h or the rounded portions 29i are formed in the laminate 29 before sintered. Therefore, the ceramic green sheets 22 and 24 or the like, which are so softer than the dielectric layers 3 as can be easily worked, are chamfered or rounded. As a result, it is possible to shorten the working time period at the time of forming the chamfered portions or the rounded portions and to reduce the working cost.

In case the chamfered portions 29h or the rounded portions 29i are formed in the sintered laminate 29, the working precision is so poor as will invite the chipping at the chamfering or rounding time. In this embodiment, however, the chamfered portions 29h or the rounded portions 29i are formed in the laminate 29 before sintered, so that the working precision can be improved. As a result, the chipping quantity of the dielectric layers 3 at the chamfering or rounding time can be reduced to reduce the dispersion among the products.

In this embodiment, the hole portions 29e and the trenches 29f can be formed in the laminate 29 to form the chamfered portions 29h or the rounded portions 29i all at once.

The ceramic green sheets 22 and 24 and so on are softer than the dielectric layers 3 but are relatively hard. In case the chamfered portions 29h or the rounded portions 29i are formed by a punching method, the ceramic green sheets 22 and 24 and so on may be chipped at the chamfering or rounding time. In this embodiment, on the contrary, the chamfered portions 29h or the rounded portions 29i are formed with a laser beam so that the working precision can be better improved. As a result, it is possible to reduce the chipping, as might otherwise be caused in the ceramic green sheets 22 and 24.

In case portions to become the capacitor 1 are individually sintered, the warpage of the capacitor 1 may become excessively large, in this embodiment, on the contrary, the portions 290 to become the capacitor 1 are sintered in the state of the laminate 29 composed of the portions 290, so that the warpage of the capacitor 1 can be reduced.

In this embodiment, the chamfered portions 2f having the chamfer dimension C1 of 0.6 mm or more are formed in the corner portions of the outer periphery of the capacitor 1. As a result, the thermal stress is hard to concentrate at the corner portions of the resin filler 42 on the side of the capacitor 1 so that the cracks can be prevented from occurring at the corner portions of the resin filler 42 on the side of the capacitor 1. Here, effects like those of the chamfered portions 2f can also be attained, even in case rounded portions 1g having a radius of curvature of 0.6 mm or more are formed at the corner portions of the outer periphery 2c of the capacitor 1.

In this embodiment, the chamfered portions 21 and/or the rounded portions 1g are formed at the corner portions of the outer periphery 2c of the capacitor 1. In case, therefore, neither the chamfered portions nor the rounded portions are formed, the distances from the signal lines existing near the corner portions of the capacitor 1 to the dielectric layers 3 are enlarged. Therefore, it is possible to reduce the signal delays of the signal lines existing near the corner portions of the capacitor 1.

If the capacitor having a warpage of 100 μm or more is to be incorporated in the wiring substrate 40, it is difficult to incorporate the capacitor in the wiring substrate 40, and it is liable that cracks are formed in the dielectric layers constituting the capacitor. In this embodiment, on the contrary, the capacitor 1 has a warpage of less than 100 μm, it is easy to incorporate the capacitor 1 in the wiring substrate 40, and the cracks are hard to form in the dielectric layers 3 when the capacitor 1 is to be incorporated in the wiring substrate 40.

In this embodiment, the trenches 2d are formed in the side faces 2c1, 2c2 and 2c3 of the capacitor 1. Therefore, the resin filler 42 enters the trenches 2d when the capacitor 1 is incorporated in the wiring substrate 40. As a result, it is possible to improve the adhesion properties between the capacitor 1 and the resin filler 42.

Sixth Embodiment

A sixth embodiment of the invention is described with reference to the accompanying drawing. This embodiment is described on the example, in which the capacitor is arranged between the insulating layers on the core substrate. Here in this embodiment, the same portions as those having been described in the first and fifth embodiments are designated by the common reference numerals, and the contents overlapping those having been described in the first and fifth embodiments may be omitted. FIG. 20 is a schematic longitudinal section of a wiring substrate, in which a capacitor according to this embodiment is incorporated.

As shown in FIG. 20, no opening is formed in the core substrate 41, but the capacitor 1" is arranged between the insulating layers 44 and 45 above the core substrate 41. The capacitor 1" of this embodiment has a total number of ten of the internal electrode layers 4 and 5, and is thinner than the capacitor 1, which has been described in connection with the fifth embodiment.

The capacitor 1" can be arranged between the insulating layers 44 and 45, for example, by the following procedure. At first, the capacitor body 2 having the external electrode layers 8 and 9 formed thereon is arranged over the insulating layer 44 formed on the core substrate 41. After this, the insulating layer 45 is placed on the capacitor body 2, and these components are pressurized, while being heated. As a result, the insulating layer 45 on the capacitor body 2 flows sideway of the capacitor body 2 so that the capacitor body 2 is arranged between the insulating layers 44 and 45. After this, via holes are formed through the insulating layers 44 and 45, and the via conductors 6 and 7 connected with the wiring layer 41b are formed in the via holes thereby to complete the capacitor 1".

In this embodiment, the capacitor 1" is arranged between the insulating layers 44 and 45 formed on the core substrate 41 so that the distance between the capacitor 1" and the semiconductor chip can be made shorter. Therefore, it is possible to reduce the wiring resistance and the inductance.

Experiment Example

An experiment example of the invention is described in the following. This experiment example examined correlations between the chamfer dimension of the chamfered portions at the corner portions of the outer periphery of the capacitor and the cracks of the resin filler.

Experimental conditions are described. At first, there were prepared a plurality of core substrates, in which the opening diameters of the capacitor housing portions in the core substrate and the radii of curvature of the rounded portions formed in the corner portions of the inner side face of the core substrate were different.

Specifically, there were prepared a plurality of core substrates, which had an opening diameter of 13.5 mm and a radius of curvature of 0.5 mm, which had an opening diameter of 13.5 min and a radius of curvature of 1.5 mm, which had an opening diameter of 14.0 mm and a radius of curvature of 0.5 mm, and which had an opening diameter of 14.0 mm and a radius of curvature of 1.5 mm. Moreover, capacitors having different chamfer dimensions are housed in the openings of those core substrates, and a resin filler was filled between the core substrates and the capacitors. The capacitors had longitudinal and transverse sizes of 12 mm, and the chamfered portions of the capacitors were formed by cutting them with a cutter. It has been evaluated on the wiring substrates whether or not cracks occurred in the resin fillers.

Experimental results are described.

TABLE 2

| Core Substrate Aperture Diameter | Core Substrate Radius of Curvature | Chamfer Dimension (mm) | c-Face Length (mm) | Evaluation |
|---|---|---|---|---|
| 13.5 mm | 0.5 mm | 1.075 | 1.52 | OK |
| | | 0.940 | 1.33 | OK |
| | | 0.863 | 1.22 | OK |
| | | 0.841 | 1.19 | OK |
| | | 0.764 | 1.08 | OK |
| | | 0.693 | 0.98 | OK |

TABLE 2-continued

| Core Substrate Aperture Diameter | Core Substrate Radius of Curvature | Chamfer Dimension (mm) | c-Face Length (mm) | Evaluation |
|---|---|---|---|---|
| | | 0.622 | 0.88 | OK |
| | | 0.601 | 0.85 | OK |
| | | 0.559 | 0.79 | OK |
| | | 0.481 | 0.68 | NG |
| | | 0.460 | 0.65 | OK |
| | | 0.453 | 0.64 | OK |
| | | 0.453 | 0.64 | NG |
| | | 0.424 | 0.60 | NG |
| | | 0.403 | 0.57 | OK |
| | | 0.346 | 0.49 | OK |
| 13.5 mm | 1.5 mm | 1.174 | 1.66 | OK |
| | | 1.096 | 1.55 | OK |
| | | 0.933 | 1.32 | OK |
| | | 0.856 | 1.21 | OK |
| | | 0.764 | 1.08 | OK |
| | | 0.679 | 0.96 | OK |
| | | 0.622 | 0.88 | OK |
| | | 0.615 | 0.87 | OK |
| | | 0.594 | 0.84 | OK |
| | | 0.559 | 0.79 | OK |
| | | 0.509 | 0.72 | NG |
| | | 0.453 | 0.64 | NG |
| | | 0.389 | 0.55 | NG |
| | | 0.382 | 0.54 | OK |
| | | 0.361 | 0.51 | NG |
| | | 0.332 | 0.47 | NG |

TABLE 3

| Core Substrate Aperture Diameter | Core Substrate Radius of Curvature | Chamfer Dimension (mm) | c-Face Length (mm) | Evaluatino |
|---|---|---|---|---|
| 14.0 mm | 0.5 mm | 1.018 | 1.44 | OK |
| | | 0.933 | 1.32 | OK |
| | | 0.870 | 1.23 | OK |
| | | 0.820 | 1.16 | OK |
| | | 0.785 | 1.11 | OK |
| | | 0.721 | 1.02 | OK |
| | | 0.608 | 0.86 | OK |
| | | 0.587 | 0.83 | OK |
| | | 0.502 | 0.71 | OK |
| | | 0.495 | 0.70 | OK |
| | | 0.481 | 0.68 | OK |
| | | 0.474 | 0.67 | NG |
| | | 0.467 | 0.66 | OK |
| | | 0.460 | 0.65 | NG |
| | | 0.453 | 0.64 | NG |
| | | 0.368 | 0.52 | OK |
| 14.0 mm | 1.5 mm | 1.153 | 1.63 | OK |
| | | 1.075 | 1.52 | OK |
| | | 0.983 | 1.39 | OK |
| | | 0.905 | 1.28 | OK |
| | | 0.771 | 1.09 | OK |
| | | 0.770 | 0.99 | OK |
| | | 0.693 | 0.98 | OK |
| | | 0.665 | 0.94 | OK |
| | | 0.622 | 0.88 | OK |
| | | 0.537 | 0.76 | OK |
| | | 0.502 | 0.71 | OK |
| | | 0.488 | 0.69 | OK |
| | | 0.417 | 0.59 | NG |
| | | 0.389 | 0.55 | OK |
| | | 0.368 | 0.52 | OK |
| | | 0.311 | 0.44 | NG |

As shown in Table 2 and Table 3, cracks occurred in the resin filler in case the chamfered portions of the capacitor had the chamfer dimension of 0.6 mm or less. In case the chamfered portions of the capacitor had a chamfer dimension of 0.6 mm or more, no crack had occurred in all the resin fillers.

From this result, it has been confirmed that the occurrence of cracks in the resin filler could be suppressed in case the chamfered portions of a chamfer dimension of 0.6 mm or more were formed in the corner portions of the outer peripheries of the capacitors. Here, it is thought that similar effects can be attained in case the rounded portions of a radius of curvature of 0.6 mm or more are formed in the corner portions of the outer peripheries of the capacitors.

The invention should not be limited to the described contents of the foregoing embodiments, but the structures or materials and the arrangements of the individual members could be suitably modified without departing from the gist of the invention. The foregoing embodiments have been described with the laminate 29 provided with the portions 290 to become the capacitor 1', but the laminate 29 may be provided with at least one portion 290 to become the capacitor 1'. Moreover, the notched holes have been described with the chamfered portions 29b or the rounded portions 29i, but the notches may be not only the chamfered portions 29h or the rounded portions 29i but may take any desired shape such as a polygonal shape other than the rectangular shape. Even this case can acquire effects substantially similar to those of the first and second embodiments.

Seventh Embodiment

Figure 24:
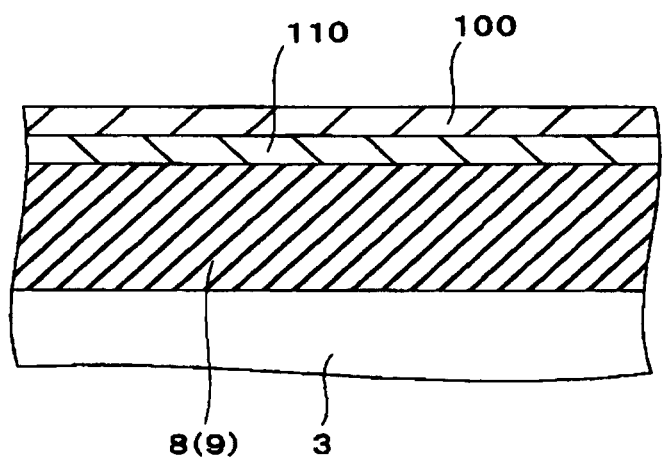
FIG. 24 is an enlarged schematic view of the vicinity of the external electrode layer according to the seventh embodiment.
Figure 25A:
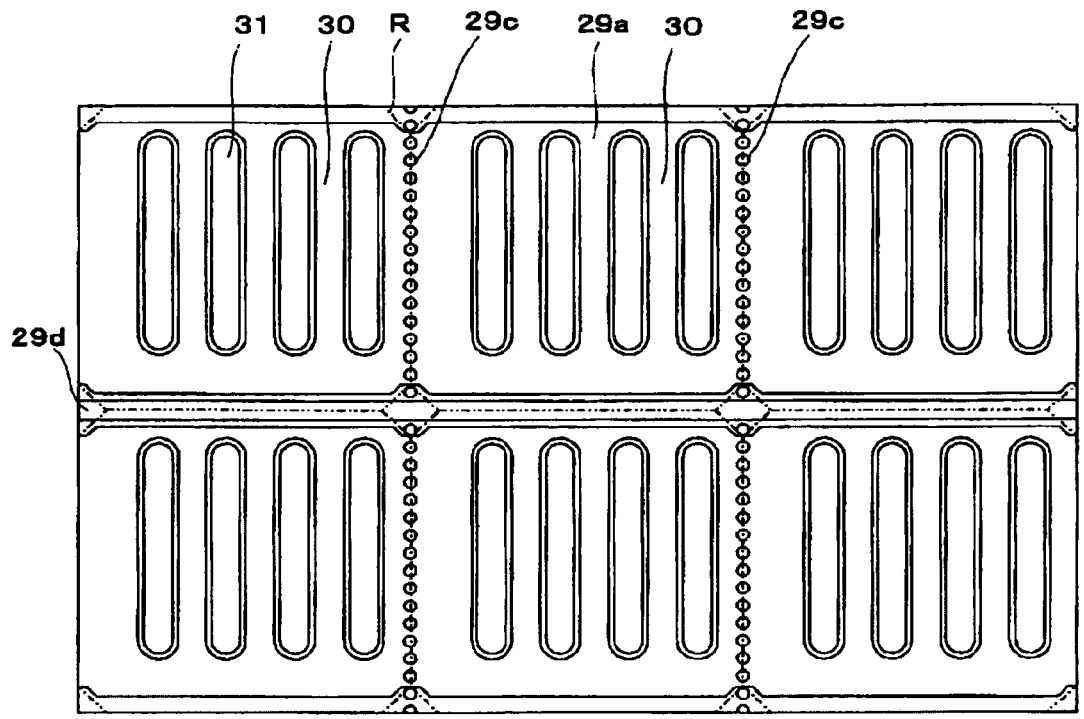
FIG. 25A and FIG. 25B are schematic top plan views of the laminate according to the seventh embodiment.
Figure 25B:
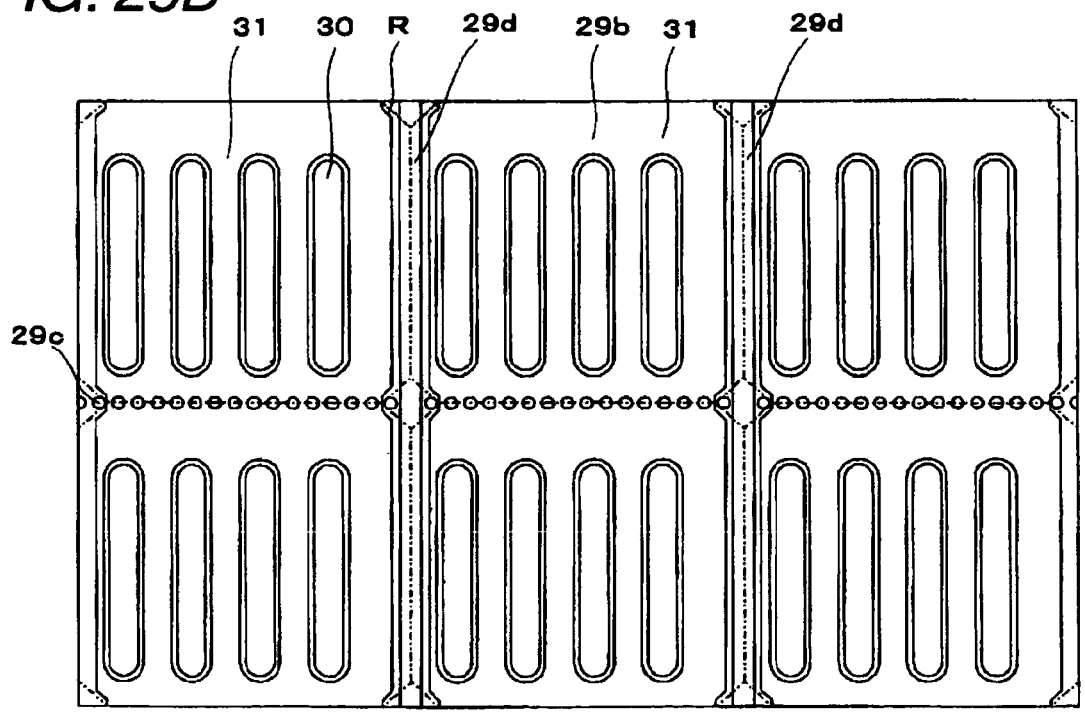
Figure 26:
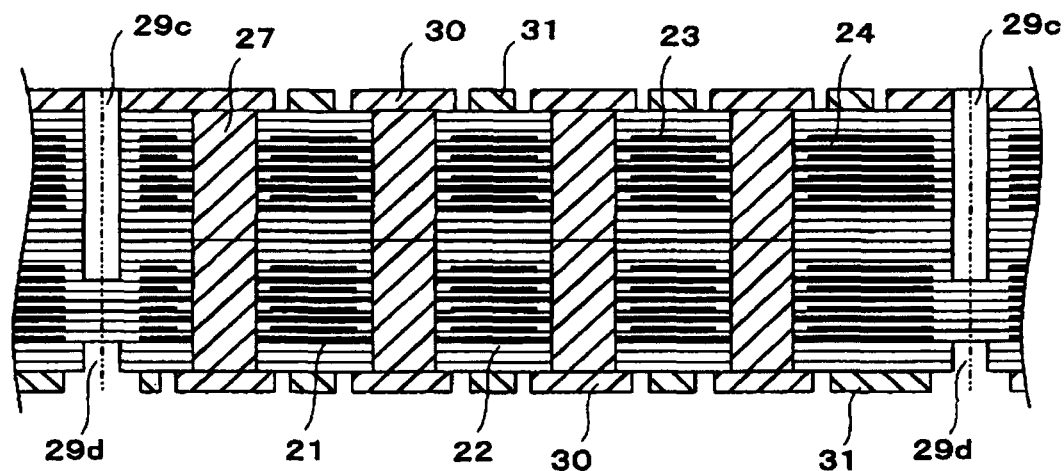
FIG. 26 is a schematic longitudinal section of the laminate according to the seventh embodiment.
Figure 27:
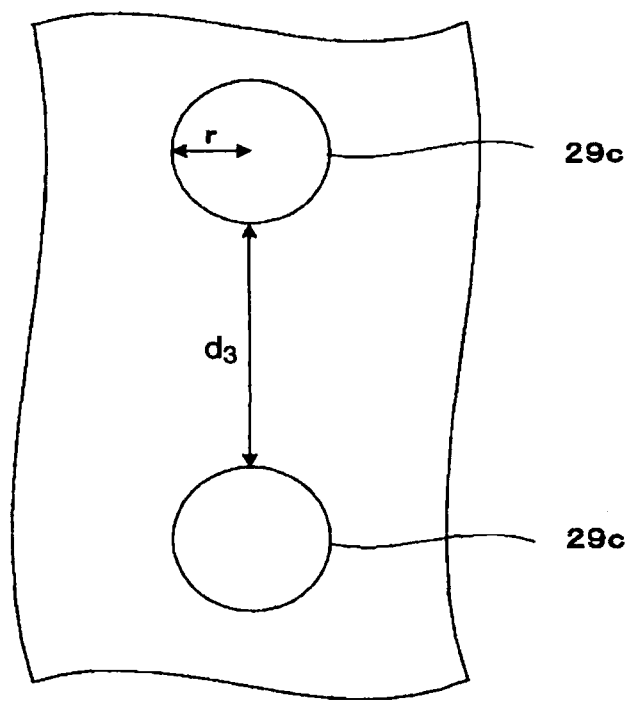
FIG. 27 is a schematic top plan view of the laminate according to the seventh embodiment.

A seventh embodiment of the invention is described in the following with reference to the accompanying drawings. FIG. 1A and FIG. 1B are schematic top plan views of a capacitor to be incorporated in a wiring substrate in accordance with the embodiment, and FIG. 2A and FIG. 2B are schematic side elevations of the capacitor to be incorporated in the wiring substrate in accordance with the embodiment. FIG. 3A is a schematic longitudinal section of the capacitor to be incorporated in the wiring substrate, when cut along line A-A of FIG. 1A; FIG. 3B is a schematic longitudinal section of the capacitor to be incorporated in the wiring substrate, when cut along line B-B of FIG. 1A; and FIG. 24 is an enlarged schematic view of the vicinity of the outer periphery of a capacitor body according to the embodiment.

A capacitor 1 to be incorporated in the wiring substrate (as will be shortly called the "capacitor") as shown in FIG. 1A to FIG. 3B, is a laminated capacitor formed into a rectangular parallelepiped shape and having a warpage less than 100 μm. The capacitor 1 has a capacitor body 2 forming the core of the capacitor 1. The capacitor body 2 is constituted to include a plurality of dielectric layers 3 laminated in the vertical direction, and a plurality of internal electrode layers 4 (i.e., first internal electrode layers) and a plurality of internal electrode layers 5 (i.e., second internal electrode layers) arranged between the dielectric layers 3.

The external electrode layer 8 is formed on the via conductors 6 and is electrically connected with the via conductors 6. On the other hand, the external electrode layer 9 is formed on the via conductors 7 and is electrically connected with the via conductors 7.

On either the side of the first principal face 2a or the side of the principal face 2b, the external electrode layers 8 and the external electrode layers 9 are spaced from each other and are electrically insulated from each other. The distance d2 between the external electrode layers 8 and the external electrode layers 9 is 30 to 300 μm at some portion.

On the surfaces of the external electrode layers 8 and 9, as shown in FIG. 24, there is formed the plated films 100 for improving the adhesion properties with the later-described insulating layers 44 and 48 and via conductors 61 and 62 and so on. The plated films 100 also have a function to prevent oxidations of the external electrode layers 8 and 9. The plated films 100 are formed by an electrolytic plating method. The plated films 100 are made from an electrically conductive material such as Au and Cu.

Between the external electrode layers 8 and 9 and the plated film 100, there is formed a plated film 110 for suppressing the reduction of the adhesion properties with the external electrode layers 8 and 9 and the plated film 100. When the ceramic material is contained in the external electrode layers 8 and 9, as described above, the ceramic material may be exposed to the surfaces of the external electrode layers 8 and 9, thereby to lower the adhesion properties between the external electrode layers 8 and 9 and the plated film 100. In order to the adhesion properties from being lowered, the plated film 110 is formed. This plated film 110 is formed by the electrolytic plating method.

Figure 28A:
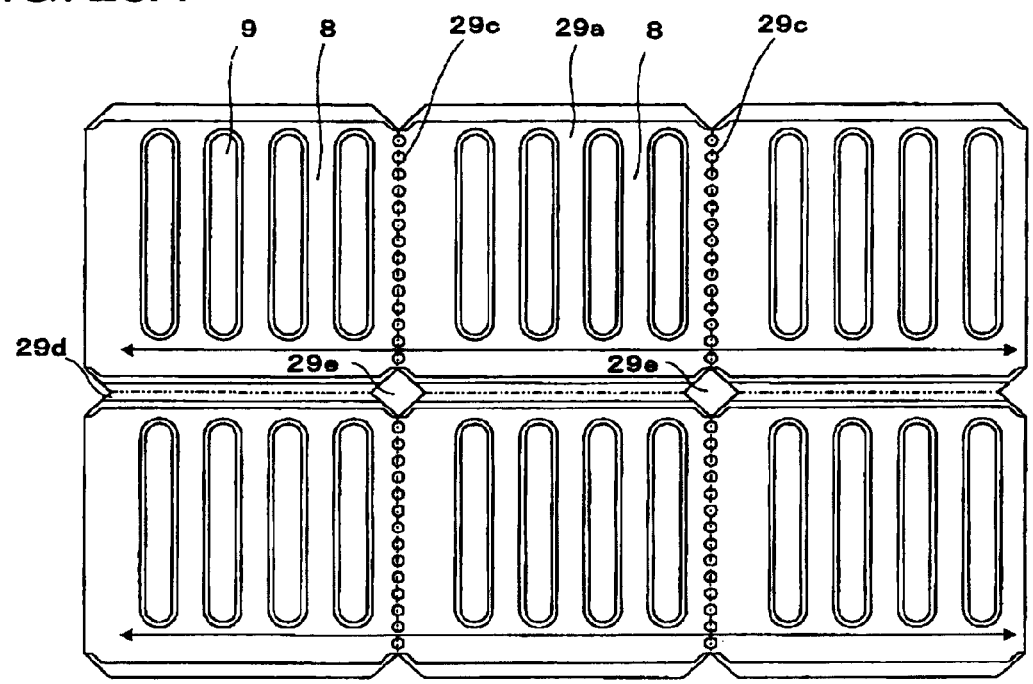
FIG. 28A and FIG. 28B are schematic top plan views of the laminate according to the seventh embodiment.
Figure 28B:
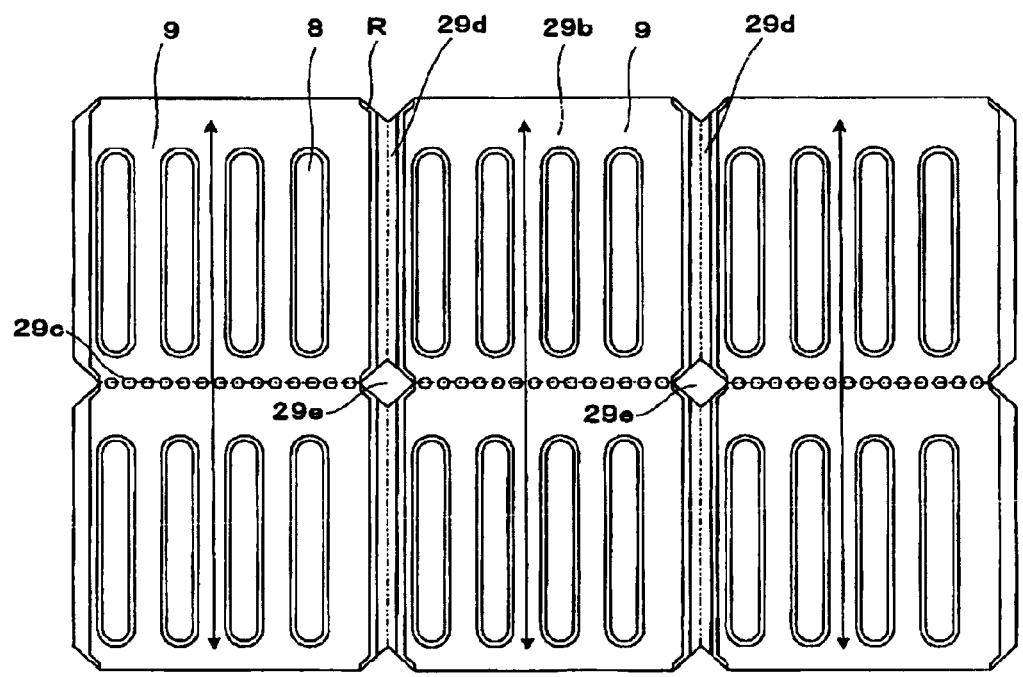

Individually in the side faces 2c1, 2c2 and 2c3, as shown in FIG. 2A and FIG. 28, there are formed the semicylindrical recesses 2d extending in the thickness direction of the capacitor 1, and the trenches 2e extending in the outer peripheral direction of the capacitor 1. In this embodiment, the trenches 2d and 2e are formed by dividing the laminate 29 along the later-described break trenches 29c and 29d. Here in this embodiment, the trenches 2d and 2e are not formed in the side face 2c4, but may also be formed in the side face 2c4.

After the external electrode patterns 30 and 31 were formed on the first principal face 29a and the second principal face 29b, perforated break trenches 29c (first break trenches) and continuous line break trenches 29d (second break trenches) extending through the external electrode patterns 30 and 31 are individually formed by a laser beam or the like along the boundaries of the capacitor forming areas R (FIG. 25A, FIG. 25B, FIG. 26 and FIG. 27).

On the side of the first principal face 29a, the break trenches 29c are formed in the boundaries along the transverse direction of the first principal face 29a in the capacitor forming areas R, and the break trenches 29d are formed in the boundary along the longitudinal direction of the second principal face 29b in the capacitor forming areas R.

On the side of the second principal face 29b, the break trenches 29c are formed in the boundaries along the longitudinal direction of the second principal face 29b in the capacitor forming areas R, and the break trenches 29d are formed in the boundary along the transverse direction of the second principal face 29b in the capacitor forming areas R.

The break trenches 29d are so formed on the sides of the first principal face 29a and the second principal face 29b as to intersect the break trenches 29c at right angles. Here, the break trench 29c formed on the side of the second principal face 29b is formed at positions corresponding to the break trenches 29d formed on the side of the first principal face 29a and along the break trenches 29d formed on the side of the first principal face 29a. Moreover, the break trenches 29d formed on the side of the second principal face 29b are at positions corresponding to the break trenches 29c formed on the side of the first principal face 29a and along the break trenches 29c formed on the side of the first principal face 29a.

The depth of the break trenches 29c is desired to be 20% or more and 70% or less of the thickness of the laminate 29. These ranges are desired because the range of 20% or more allows the laminate 29 to be easily divided along the break trenches 29c, and because the range of 70% or less can reduce the cracking or chipping of the break trenches 29c in the degreasing, sintering and transferring steps after the break trenches 29c were formed.

In case the break trenches 29C are cylindrical, the break trenches 29c are desired to have a radius r of 30 to 75 μm. This is because the plating liquid cannot be removed, in case it invades into the break trenches 29c, by the subsequent rinsing operation, if less than 30 μm, and because the areas of the internal electrode layers 4 and 5 becomes insufficient, to cause shortage of the capacity, if more than 75 μm.

It is preferred that the distance d3 between the break trenches 29c is more than 0 μm and less than 500 μm. This is because the plated film explained below cannot be formed in case the distance d3 is 0 μm, and it may be difficult to divide the laminate 29 for each of the capacitor forming areas R in case the distance d3 is 500 μm or more.

After the break trenches 29c and 29d were formed in the laminate 29, the rectangular hole portions 29e extending in the thickness direction of the laminate 29 are formed (as shown in FIG. 10A) along the boundary of the corner portions of the capacitor forming areas R. The hole portions 29e are formed to form the chamfered portions 2f in the capacitor 1. Here in this embodiment, the hole portions 29e are formed after the break trenches 29c and 29d were formed, but the break trenches 29c and 29d may also be formed after the hole portions 29e were formed.

After the hole portions 29e were formed in the laminate 29, the laminate 29 having the external electrode layers 8 and 9 formed therein is degreased, and is sintered at a predetermined temperature for a predetermined time period. By this sintering, the internal electrode patterns 21 and 23, the ceramic green sheets 22 and 24, the via conductor pastes 27 and 28 and the external electrode patterns 30 and 31 are sintered to form the internal electrode layers 4 and 5, the dielectric layers 3, the via conductors 6 and 7 and the external electrode layers 8 and 9 (FIG. 10B).

After this, the oxide films formed on the surfaces of the external electrode layers 8 and 9 by the sintering is removed by a polishing method such as the jet blasting method. After this, an electric current is fed to the external electrode layers 8 and 9 to form the plated films 100 and 110 on the external electrode layers 8 and 9 by the electrolytic plating method. On the side of the first principal face 29a, there are formed the break trenches 29c, which are perforated so that the external electrode layers 8 are electrically connected with each other in the longitudinal direction of the first principal face 29a. As a result, the electric current flows (FIG. 25A) from the external electrode layers 8 of the capacitor forming areas R, as positioned at one end of the longitudinal direction of the first principal face 29a, to the external, electrode layers 8 of the capacitor forming areas K, as positioned at the other end, so that the plated films 100 and 110 can be formed as a whole in the longitudinal direction of the first principal face 29a on the external electrode layers 8 by the electrolytic plating method. As on the side of the second principal face 29b, moreover, on the side of the second principal face 29b, the electric current flows (FIG. 28B) from the external electrode layers 8 of the capacitor forming areas R, as positioned at one end of the second principal face 29b in the transverse direction, to the external electrode layers 9 of the capacitor forming areas R, as positioned on the other end. Here, arrows in FIG. 28A and FIG. 28B indicate the directions, in which the electric current flews.

Figure 29:
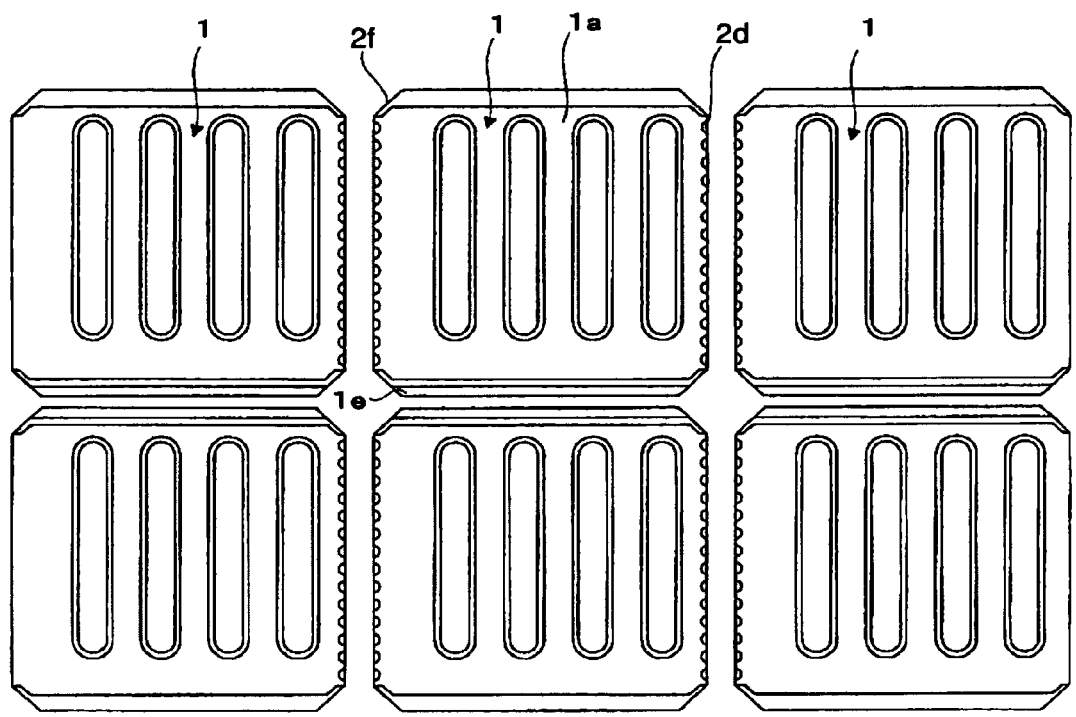
FIG. 29 is a schematic top plan view of the laminate according to the seventh embodiment.
Figure 30:
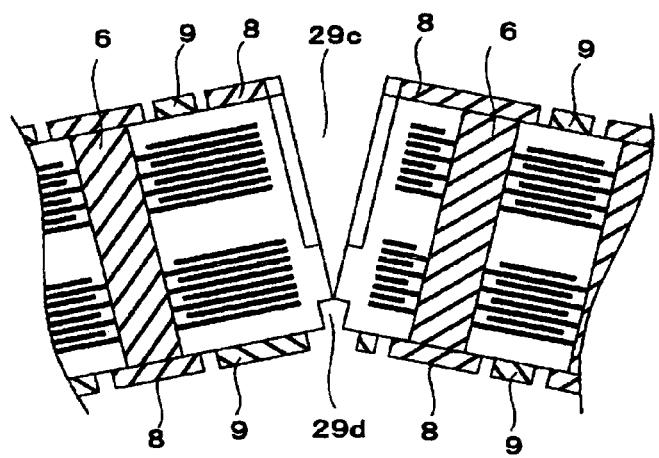
FIG. 30 is a schematic view showing the behavior at the time when the laminate according to the seventh embodiment is divided.

At last, the laminate 29 is divided along the break trenches 29c and 29d for each of the capacitor forming areas R thereby to manufacture the capacitor 1 or the like shown in FIG. 1 (FIG. 29). In the thickness direction of the laminate 29, the break trenches 29d are formed at positions corresponding to the break trenches 29c. It is, however, desired that the laminate 29 is so divided that the portions near the break trenches 29c is earlier cut away than the portions near the break trenches 29d (FIG. 30). This desire is caused by the following reason. Since the external electrode layers 8 and the plated films 100 and 110 exist between the break trenches 29c, the external electrode layers 8 and the plated films 100 and 110 near the break trenches 29c may not be cut along the break trenches 29c if the portions near the break trenches 29d are earlier cut away than the portions near the break trenches 29c.

Specifically, the portions near the break trenches 29c on the side of the first principal face 29a are so divided for every columns that they may be cut away earlier than the portions near the break trenches 29d on the side of the second principal face 29b, and the portions near the break trenches 29c on the side of the second principal face 29b are so divided that they may be cut away earlier than the portions near the break trenches 29d on the side of the first principal face 29a. Incidentally, the portions near the break trenches 29c on the side of the second principal face 29b are so divided for every columns that they may be cut away earlier than the portions near the break trenches 29d on the side of the first principal face 29a, and the portions near the break trenches 29c on the side of the first principal face 29a are so divided that they may be cut away earlier than the portions near the break trenches 29d on the side of the second principal face 29b.

The capacitor 1''' is incorporated, when used, in the wiring substrate. The wiring substrate having the incorporated capacitor 1''' is described in the following. FIG. 16 is a schematic longitudinal section of the wiring substrate, in which the capacitor according to this embodiment is incorporated. The descriptions on the first embodiment with reference to FIG. 16 are also applied to those of this embodiment.

In this embodiment, on the side of the first principal face 29a, the perforated break trenches 29c extending through the external electrode layers 8 are formed in the laminate 29, so that the external electrode layers 8 are electrically connected with each other in the longitudinal direction of the first principal face 29a. As a result, the plated films 100 and 110 are formed as a whole by the electrolytic plating method in the longitudinal direction of the first principal face 29a. Therefore, it is possible to form the plated films 100 and 110 efficiently. Here, effects similar to the aforementioned ones can be attained because the break trenches 29c are also formed on the side of the second principal face 29b.

In this embodiment, the plated films 100 and 110 are formed by the eletrolytic plating method so that they can be precisely formed on the external electrode layers 8 and 9. Even in case, therefore, the distance d2 between the external electrode layers 8 and the external electrode layers 9 is as narrow as 30 to 300 μm, the external electrode layers 8 and the external electrode layers 9 are hard to connect through the plated films 100 and 110, so that the electric short can be suppressed.

In this embodiment, the plated films 100 and 110 can be precisely separated out, even if the distance d2 between the external electrode layers 8 and the external electrode layers 9 is as relatively narrow as 30 to 300 μm. Moreover, the plated films 100 and 110 can be plated in the aggregate state of products, and the aggregate itself can be homogeneously plated as a whole.

In this embodiment, the trenches 2d are formed in the side faces 2c1, 2c2 and 2c3 of the capacitor 1'''. When the capacitor 1''' is incorporated in the wiring substrate 40, the resin filler 42 enters the trenches 2d. It is, therefore, possible to improve the adhesion properties between the capacitor 1''' and the resin filler 42.

In this embodiment, the chamfered portions 2f having the chamfer dimension C1 of 0.6 mm or more are formed at the corner portions of the outer periphery 2c of the capacitor body 2. As a result, the thermal stress is hard to concentrate at the corner portions of the resin filler 42 on the side of the capacitor 1''' so that the cracks can be prevented from occurring at the corner portions of the resin filler 42 on the side of the capacitor 1'''. Here, effects like those of the chamfered portions 2f can also be attained, even in case rounded portions having a radius of curvature of 0.6 mm or more are formed at the corner portions of the outer periphery 2c of the capacitor body 2.

In this embodiment, the chamfered portions 2f and the rounded portions are formed at the corner portions of the outer periphery 2c of the capacitor body 2. In case, therefore, neither the chamfered portions 2f nor the rounded portions are formed, the distances from the signal lines existing near the corner portions of the capacitor 1''' to the dielectric layers 3 are enlarged. Therefore, it is possible to reduce the signal delays of the signal lines existing near the corner portions of the capacitor 1'''.

Eighth Embodiment

An eighth embodiment of the invention is described with reference to the accompanying drawing. This embodiment is described on the example, in which the capacitor is arranged between the insulating layers an the core substrate. Here in this embodiment, the same portions as those having been described in the first and seventh embodiments are designated by the common reference numerals, and the contents overlapping those having been described in the first and seventh embodiments may be omitted. FIG. 20 is a schematic longitudinal section of a wiring substrate, in which a capacitor according to this embodiment is incorporated.

The invention should not be limited to the described contents of the foregoing embodiments, but the structures and materials and the arrangements of the individual members could be suitably modified without departing from the gist thereof.

This application is based on Japanese Patent Application JP 2005-370945, filed Dec. 22, 2005, Japanese Patent Application JP 2005-37094.6, filed Dec. 22, 2005, and Japanese Patent Application IP 2005-370947, filed Dec. 22, 2005, the entire contents of which are hereby incorporated by reference, the same as if set forth at length.

What is claimed is:

1. A method for manufacturing a capacitor including a plurality of dielectric layers and a plurality of internal electrode layers provided between different dielectric layers, the method comprising:

forming an unsintered laminate including a plurality of ceramic green sheets to become said dielectric layers, and a plurality of internal electrode patterns provided between different ceramic green sheets, said internal electrode patterns to become said internal electrode layers;

forming notched holes in an outer periphery of a portion of said laminate which is to become said capacitor;

forming break trenches between individual portions of the laminate; and sintering said laminate having said notched holes formed, wherein said laminate includes a plurality of portions, each portion is to become said capacitor, and said forming said notched holes comprises forming holes at boundaries extending between the individual portions of said laminate in a thickness direction of said laminate and trenches extending in said outer periphery of said laminate in said thickness direction, and the break trenches have a depth less than the thickness of the laminate.

2. The method as claimed in claim 1, wherein said forming of said notched holes is carried out with a laser.

3. The method as claimed in claim 1, wherein said notched holes are at least one of chamfered portions and rounded portions.

4. The method as claimed in claim 1, wherein the method further comprises dividing said laminate, after said sintering, into the plurality of portions, each of the portions is to become said capacitor.

5. The method as claimed in claim 1, wherein the hole portions are formed to corner portions of the outer periphery of the portion of the laminate which is to become the capacitor.

6. The method as claimed in claim 1, further comprising:
forming external electrode patterns on at least a portion of a surface of the laminate,
wherein the notched holes are formed by forming trenches, which extend in the outer periphery of the laminate in the thickness direction and extend through the external electrode patterns, with a laser.

* * * * *